(12) United States Patent
Mangay-Ayam, Jr. et al.

(10) Patent No.: US 9,552,848 B2
(45) Date of Patent: Jan. 24, 2017

(54) SOLID STATE DRIVE WITH IMPROVED ENCLOSURE ASSEMBLY

(71) Applicants: Rogelio Gazmen Mangay-Ayam, Jr., Imus Cavite (PH); Elbert Castro Esguerra, Makati (PH); Jerico Alge Parazo, Quezon (PH); Christopher Dayego Galvez, Valenzuela (PH); Allan Famitanco Cruz, Santa Ana Metro Manila (PH)

(72) Inventors: Rogelio Gazmen Mangay-Ayam, Jr., Imus Cavite (PH); Elbert Castro Esguerra, Makati (PH); Jerico Alge Parazo, Quezon (PH); Christopher Dayego Galvez, Valenzuela (PH); Allan Famitanco Cruz, Santa Ana Metro Manila (PH)

(73) Assignee: BiTMICRO Networks, Inc., Fremont, CA (US)

(*) Notice: Subject to any disclaimer, the term of this patent is extended or adjusted under 35 U.S.C. 154(b) by 259 days.

(21) Appl. No.: 14/182,303

(22) Filed: Feb. 18, 2014

(65) Prior Publication Data

US 2014/0160661 A1    Jun. 12, 2014

Related U.S. Application Data

(63) Continuation of application No. 12/876,094, filed on Sep. 3, 2010, now Pat. No. 8,665,601.
(Continued)

(51) Int. Cl.
*H05K 5/00* (2006.01)
*H05K 7/00* (2006.01)
(Continued)

(52) U.S. Cl.
CPC ............... *G11C 5/04* (2013.01); *H05K 1/144* (2013.01); *H05K 5/0008* (2013.01);
(Continued)

(58) Field of Classification Search
CPC ......... G11C 5/04; H05K 7/1417; H05K 1/144; H05K 2201/2018
(Continued)

(56) References Cited

U.S. PATENT DOCUMENTS 5,038,250 A * 8/1991 Uenaka ............... G06K 19/077
                                                              235/492
5,510,959 A * 4/1996 Derstine ............. H05K 5/0273
                                                              174/358

(Continued)

OTHER PUBLICATIONS

Office Action for U.S. Appl. No. 12/876,094 dated Jul. 18, 2013.
(Continued)

*Primary Examiner* — Sherman Ng

(57) ABSTRACT

The present invention pertains to a hard disk drive form factor compatible solid-state storage device enclosure assembly that protects circuit boards contained within the enclosure from environmental disruption, such as mechanical stress, vibration, external electronic disruption, or any combination of these, while allowing for a variable number of circuit boards in the SSD enclosure. In another embodiment, the solid-state storage device enclosure assembly, or a similar circuit board assembly, includes an alignment guide that precludes a circuit board from being misaligned within the enclosure.

25 Claims, 34 Drawing Sheets

Related U.S. Application Data

(60) Provisional application No. 61/239,787, filed on Sep. 4, 2009.

(51) Int. Cl.
*H05K 1/14* (2006.01)
*G11C 5/04* (2006.01)
*H05K 7/14* (2006.01)
*H05K 9/00* (2006.01)

(52) U.S. Cl.
CPC ......... *H05K 5/0069* (2013.01); *H05K 7/1417* (2013.01); *H05K 9/0066* (2013.01); *H05K 2201/2018* (2013.01)

(58) Field of Classification Search
USPC ........ 361/737, 752, 728–730, 800, 816, 818
See application file for complete search history.

(56) References Cited

U.S. PATENT DOCUMENTS

| | | | |
|---|---|---|---|
| 5,672,844 A * | 9/1997 | Persson | H05K 9/0039 174/351 |
| 6,128,194 A * | 10/2000 | Francis | H05K 5/0269 235/492 |
| 6,317,330 B1 | 11/2001 | Portman et al. | |
| 6,462,958 B2 * | 10/2002 | Ogata | G11B 33/025 174/363 |
| 6,683,245 B1 * | 1/2004 | Ogawa | H05K 9/0037 174/382 |
| 6,757,845 B2 | 6/2004 | Bruce | |
| 6,762,939 B2 * | 7/2004 | Summers | H05K 1/0204 165/185 |
| 7,008,240 B1 * | 3/2006 | Wang | H05K 5/0217 361/737 |
| 7,826,243 B2 | 11/2010 | Bruce et al. | |
| 8,665,601 B1 | 3/2014 | Mangay-Ayam, Jr. et al. | |
| 2007/0180264 A1 * | 8/2007 | Ni | H05K 5/0269 713/186 |
| 2008/0212297 A1 | 9/2008 | Ni et al. | |
| 2008/0266816 A1 | 10/2008 | Ni et al. | |

OTHER PUBLICATIONS

Notice of allowance/allowability for U.S. Appl. No. 12/876,094 dated Nov. 13, 2013.
Office Action for U.S. Appl. No. 12/876,094 dated Feb. 4, 2013.
Office Action for U.S. Appl. No. 12/876,094 dated Sep. 25, 2012.

* cited by examiner

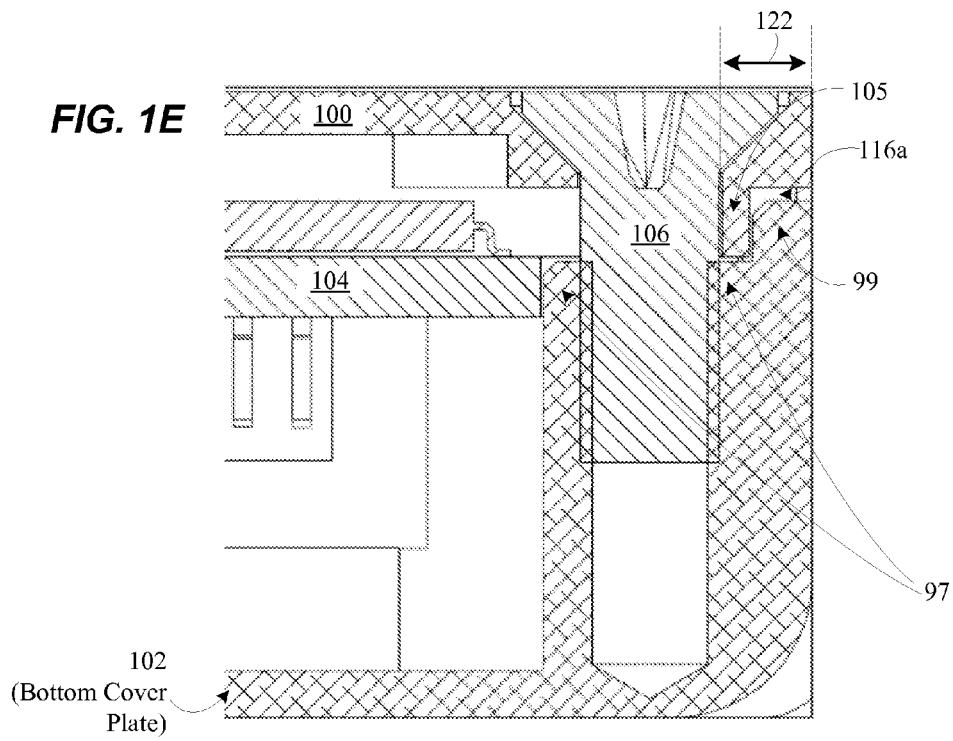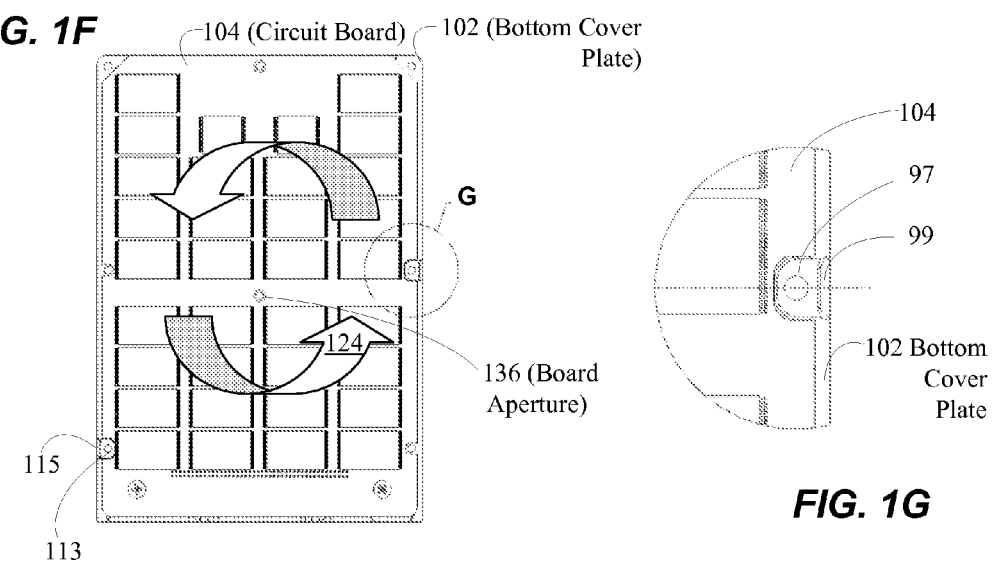

Top Cover Plate (3.5" Milled Version) - Bottom View 3.5" Bottom Cover Plate –
Top View 3.5" SSD, includes enclosure assembly having a
stamped Top Cover Plate – Perspective View Top Cover Plate
(3.5" Stamped Version)
*Top* View Top Cover Plate
(3.5" Stamped Version)
Section S-S View of FIG. 17B Top Cover Plate (3.5" Stamped Version)
Bottom View Top Cover Plate (3.5" Stamped Version)
*Bottom Perspective View*

Circuit Board shown without components -
For 2.5" Enclosure Assembly

FIG. 6A
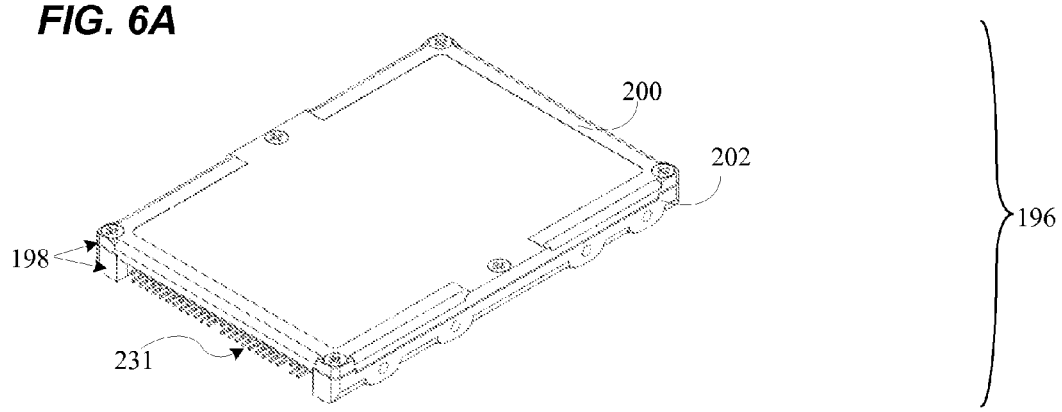
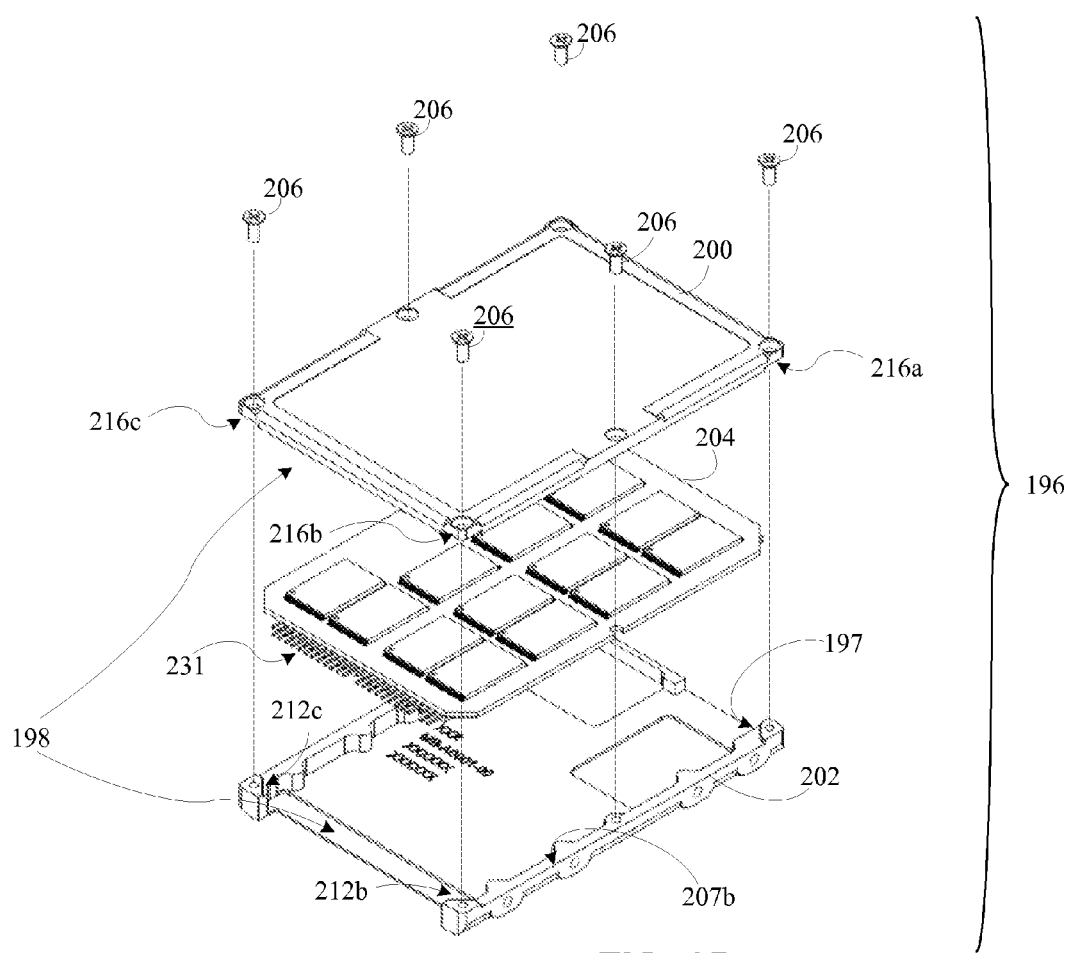
FIG. 6B

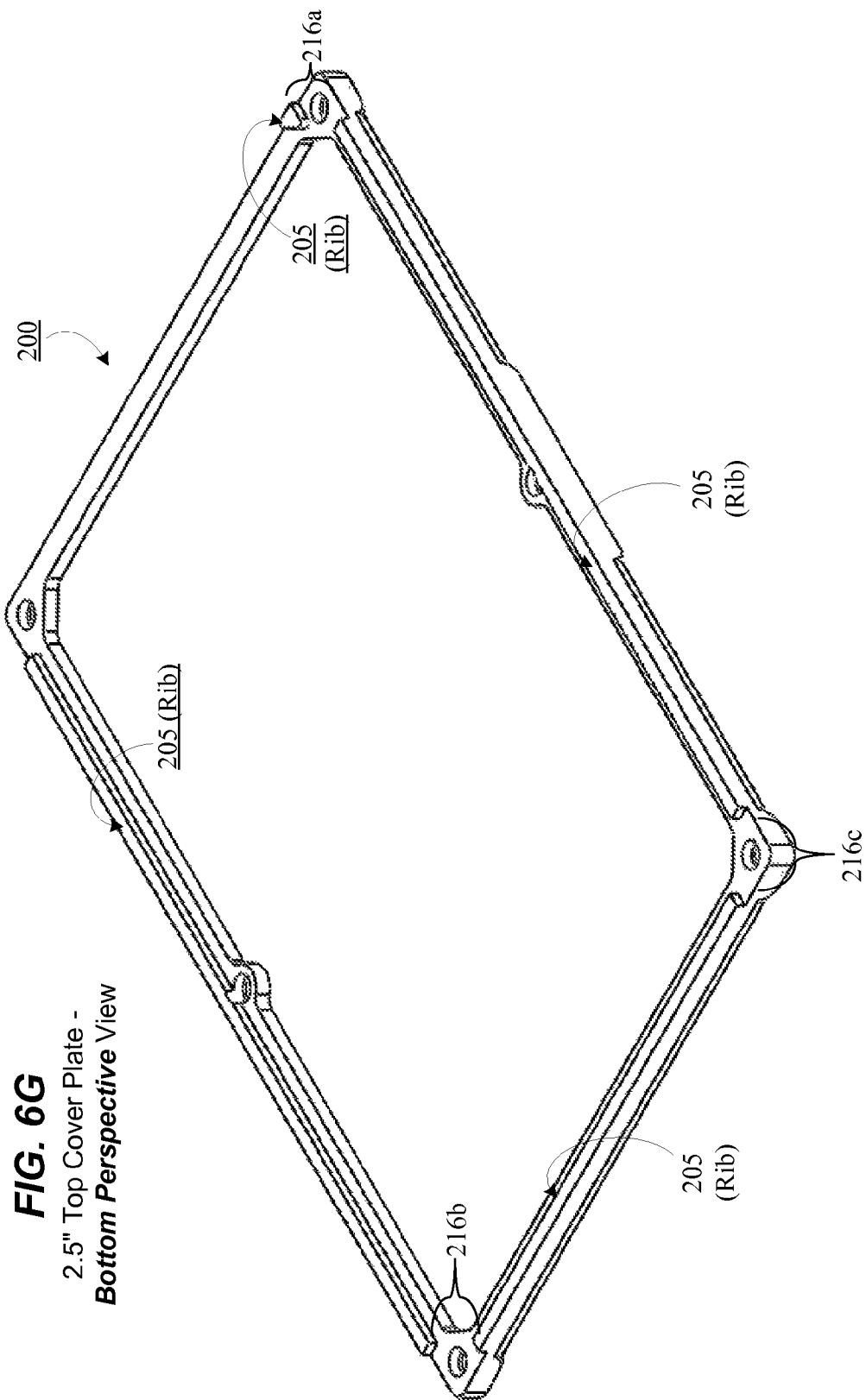

2.5" Top Cover Plate -*Bottom* View 3.5" Top Cover Plate *Bottom* Perspective View 3.5" Spacer – Top Perspective View Board to Board Connectors – Partial View of Section E-E of *FIG. 12A*.

3.5" Spacer – Bottom Perspective View 3.5" Spacer – Bottom View 3.5" Multi-Stack Embodiment

FIG. 14A (2.5" two-stack embodiment)
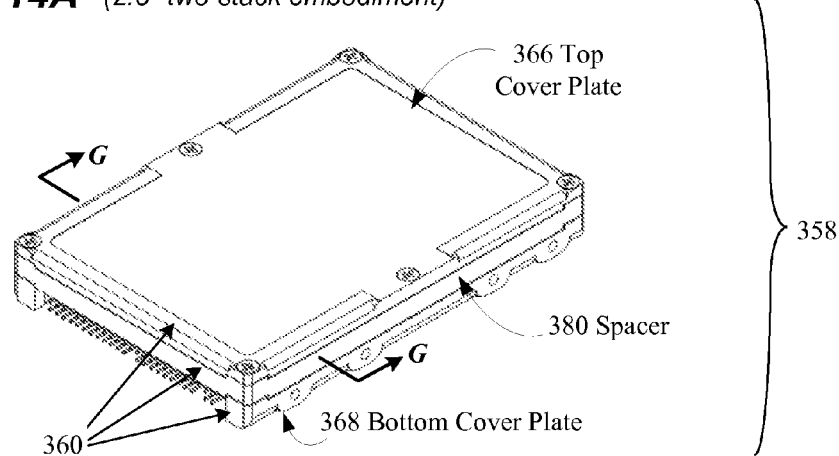
FIG. 14C
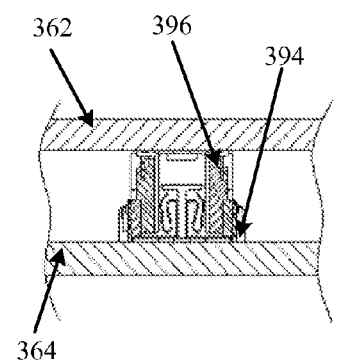
FIG. 16
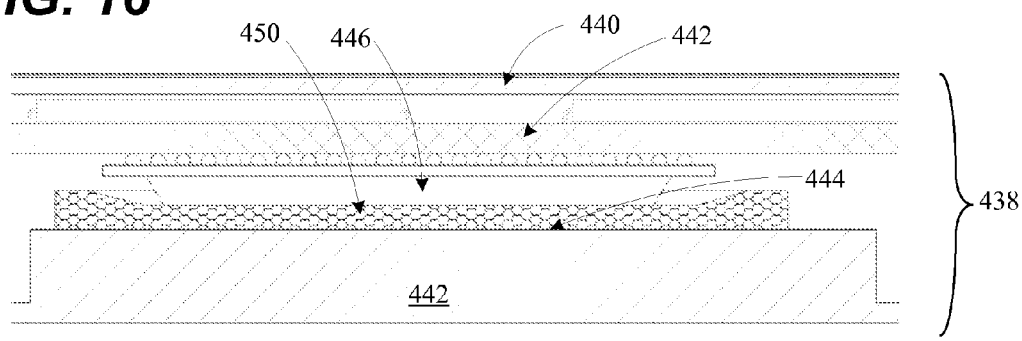

2.5" Spacer – Bottom Perspective View 2.5" Spacer – *Bottom* View 2.5" Spacer –
Exploded Partial Section View 2.5" Top Cover Plate -*Bottom* View 2.5" Bottom Cover Plate with Circuit Board -Top View 2.5" Multi-Stack Embodiment

SOLID STATE DRIVE WITH IMPROVED ENCLOSURE ASSEMBLY

CROSS-REFERENCE(S) TO RELATED APPLICATIONS

This application is a continuation application of United States Application, entitled "Solid State Drive With Improved Enclosure Assembly", having a filing date of 3 Sep. 2010 and Ser. No. 12/876,094 and issued as U.S. Pat. No. 8,665,601, which claims the benefit of and a priority to United States Provisional Application, entitled "Solid State Drive With Improved Enclosure Assembly", having a filing date of 4 Sep. 2009 and Ser. No. 61/239,787. Application Nos. 12/876,094 and 61/239,787 are hereby fully incorporated herein by reference.

BACKGROUND

(1) Technical Field

The present invention relates to non-volatile storage devices and solid-state storage devices. More particularly, the present invention relates to enclosures and circuit board assemblies for such storage devices.

SUMMARY

The present invention pertains to a hard disk drive form factor compatible solid-state storage device enclosure assembly that protects circuit boards contained within the enclosure from environmental disruption, such as mechanical stress, vibration, external electronic disruption, or any combination of these, while allowing for a variable number of circuit boards in the SSD enclosure. In another embodiment, the solid-state storage device enclosure assembly, or a similar circuit board assembly, includes an alignment guide that precludes a circuit board from being misaligned within the enclosure.

BRIEF DESCRIPTION OF THE DRAWINGS

FIG. 1E is section E-E in FIG. 1C;

FIG. 1F is a top view of the embodiment disclosed in FIG. 1A without the top cover plate;

FIG. 1G is portion G which shows an enlarged top view of the alignment guide and tab provided on the enclosure assembly portion shown in FIG. 1F;

FIG. 6A is a perspective illustration of a SSD that includes one circuit board and an improved enclosure assembly that complies with the 2.5" HDD standard form factor in accordance with another embodiment of the present invention;

FIG. 6B is an exploded view of the embodiment disclosed in FIG. 6A;

FIG. 6G is a bottom perspective view of the 2.5" top cover plate disclosed in FIGS. 6A-6D;

FIGS. 14A-C disclose various inventive concepts relating to a 2.5 inch HDD form factor compliant SSD that has an enclosure assembly which can support more than one circuit board in accordance with yet another embodiment of the present invention;

FIG. 16 is a cross-sectional view of a SSD enclosure assembly having a bottom cover plate that includes a surface which is extended closer to at least one component on a circuit board is disclosed in accordance with yet another embodiment of the present invention.

DETAILED DESCRIPTION OF THE INVENTION

Figure 1A:
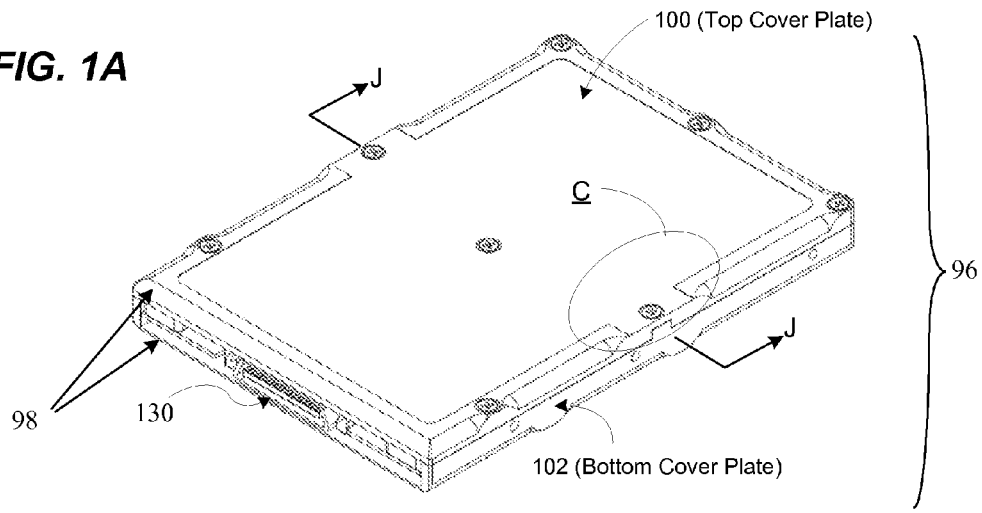
FIG. 1A is a perspective illustration of a SSD that includes a single circuit board and an improved enclosure assembly which complies with the 3.5" HDD standard form factor in accordance with one embodiment of the present invention.

In the following detailed description, for purposes of explanation, numerous specific details are set forth to provide a thorough understanding of the various embodiments of the present invention. Those of ordinary skill in the art will realize that these various embodiments of the present invention are illustrative only and are not intended to be limiting in any way. Other embodiments of the present invention will readily suggest themselves to such skilled persons having the benefit of this disclosure.

In addition, for clarity purposes, not all of the routine features of the embodiments described herein are shown or described. One of ordinary skill in the art would readily appreciate that in the development of any such actual implementation, numerous implementation-specific decisions may be required to achieve specific design objectives. These design objectives will vary from one implementation to another and from one developer to another. Moreover, it will be appreciated that such a development effort might be complex and time-consuming but would nevertheless be a routine engineering undertaking for those of ordinary skill in the art having the benefit of this disclosure.

The present invention pertains to a hard disk drive form factor compatible solid-state storage device, named "SSD", enclosure that protects circuit boards contained within the enclosure from environmental disruption, such as mechanical stress, external electronic disruption, or any combination of these, while allowing for a variable number of circuit boards in the SSD enclosure. In another embodiment, the solid-state storage device enclosure or a similar circuit board assembly, includes an alignment guide that precludes a circuit board from being misaligned or mis-installed within the enclosure.

One such enclosure may have an external dimension that complies with standard hard disk drive (HDD) standard form factors, such as 3.5 inch, 2.5 inch, 1.8 inch, 1 inch, and the like, commonly employed by computer storage device manufacturers. These form factors include a number that roughly indicates the width of the storage device but may also indicate a mounting location and type, exterior dimensions of length, width and height, and interface connector type and placement. Storage devices that comply with the same HDD form factor in terms of width and length may vary considerably in height and still be considered to comply with the same form factor.

Complying with a standard HDD form factor enables manufacturers of storage devices to avoid custom-fitting and to maximize the compatibility of their HDD form factor compliant storage devices with a variety of different host computers and storage cases and racks, including desktops, notebook, rack-mounted servers and cases, blade servers, raid arrays, SANs, NAS, and other devices that use digital mass storage devices storage. A solid-state storage device is intended to refer to a mass-storage device that performs the same or substantially similar function of a HDD but does not use any moving parts or media. SSD devices and circuit boards used in such SSD devices are known by those of ordinary skill in the art, and thus, are not further disclosed herein to avoid unnecessarily complicating this disclosure.

3.5" Single Stack Embodiment

FIGS. 1A-1J relate to a solid-state storage device 96, named "SSD" that includes a single circuit board 104 and an improved enclosure assembly 98 in accordance with one embodiment of the present invention. This embodiment may also be herein referred to as a SSD having a single-stack 3.5 inch form factor compliant SSD enclosure assembly. Enclosure assembly 98 includes a set of enclosure portions, such as a top cover plate 100 and a bottom cover plate 102, which are disposed to interlock and stack with each other as well as receive circuit board 104. Top cover plate 100 includes a rib 105 which is located on the perimeter of top cover plate 100. Rib 105 provides additional stiffness to top cover plate 100. Bottom cover plate 102 is disposed with an alignment guide 97 and a tab 99. Circuit board 104 is coupled between top and bottom cover plates 100 and 102, which are fastened together by suitable fasteners, such as a set of eight flat head screws 106. When assembled, top and bottom cover plates 100 and 102 form enclosure assembly 98 and result in a SSD having at least one circuit board, such as circuit board 104, received within an enclosure assembly that complies with a standard HDD form factor. Enclosure assembly 98 is disposed to receive circuit board 104 within rib 105 and to distribute mechanical stress across enclosure assembly 98. Circuit board 104 includes memory devices, such as NAND flash, a controller integrated circuit for controlling these memory devices, and an interface connector 130. In FIGS. 1A-1J, enclosure assembly 98 complies with the 3.5 inch HDD form factor although the present invention is not intended to be limited to this particular form factor and other form factors may be used.

Top and bottom cover plates 100 and 102 include surfaces 107a and 107b, respectively. When assembled to form SSD 96, a perimeter edge portion 108 of circuit board 104 is coupled to and located between two enclosure portions of enclosure assembly 98. In the embodiment shown, perimeter edge portion 108 is coupled to surfaces 107a and 107b and is located adjacent to a rib interior surface 110 of rib 105. Another alignment guide 112 and tab 114 are utilized although the number of alignment guides and tabs used to interlock and stack at least two enclosure portions is not intended to be limiting in any way. In addition, rib 105 includes notches 116a and 116b for receiving tabs 99 and 114, respectively. In FIGS. 1B and 1E-G, notches 116a and 116b are formed on a surface of and into rib 105 and have a depth that does not exceed the rib width 122 of rib 105, creating voids for receiving tabs 99 and 114, respectively. The number of notches formed on rib 105 is not intended to be limiting although the number of notches formed equals the number of tabs used in the embodiment shown. Moreover, the shape of the tabs and notches are also not intended to limit the scope and spirit of the invention disclosed.

Figure 1B:
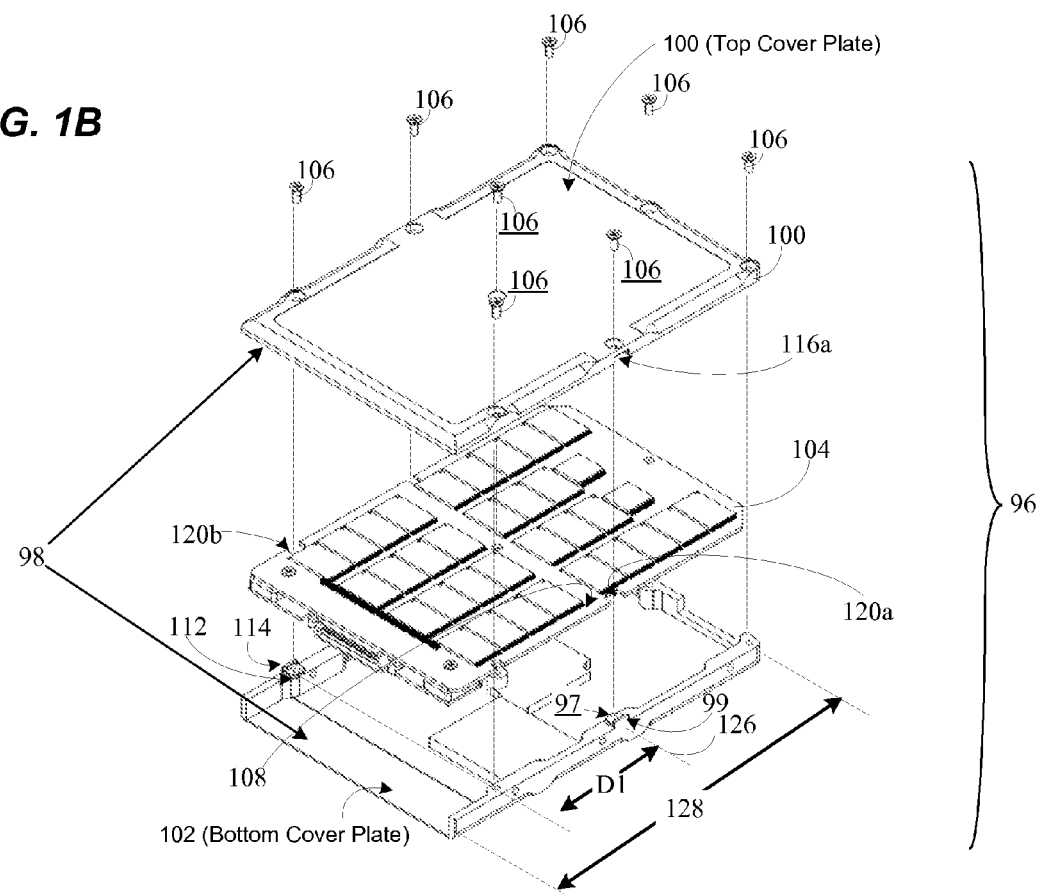
FIG. 1B is an exploded view of the embodiment disclosed in FIG. 1A.
Figure 1C:
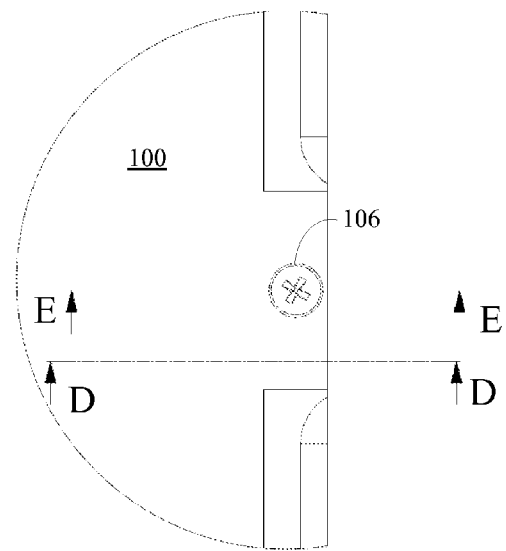
FIG. 1C is portion C which shows a partial top view of the enclosure assembly used by the SSD disclosed in FIG. 1A.

Alignment guide 97 has a height that extends through and exceeds the thickness of perimeter edge portion 108. Alignment guide 112 also has a height that extends through and exceeds the thickness of another perimeter edge portion of circuit board 104. As shown in FIGS. 1B and 1F, the positions of alignment guides 97 and 112 on bottom cover plate 102 are selected so that when a circuit board is coupled to surfaces 107a and 107b, the circuit board includes notches 120a and 120b that can receive alignment guides 97 and 112, respectively. In addition, alignment guides 97 and 112 may be positioned in an offset position relative to each other that prevents circuit board 104 from being coupled between surfaces 107a and 107b (see also FIG. 1I) in the wrong orientation.

Alignment guides 97 and 112, tabs 99 and 114, rib 105 and rib notches 116A and 116a collectively function as an interlocking and stacking mechanism that permits enclosure portions to be interlocked and stacked together. In addition, when fastened together and used to receive and enclose circuit board 104, this interlocking and stacking mechanism distributes mechanical stress, such as torsion, across the enclosure portions of enclosure assembly 98, reducing the amount of disruptive or damaging mechanical stress that might otherwise be transmitted to circuit board 104.

As a further embodiment, positioning alignment guides 97 and 112 in an offset position relative to each other provides for a "fool-proof" assembly of SSD 96 because this prevents a circuit board with matching notches, such as circuit board 104, from being coupled between surfaces of enclosure portions, such as surfaces 107a and 107b in the wrong orientation 124. For example, as illustrated in FIG. 1B and FIG. 1F, the positions of alignment guides 97 and 114, are offset relative to each other, precluding circuit board 104 from inadvertently being placed upside down relative to one of the enclosure portions of enclosure assembly 98, such as bottom cover plate 102. Alignment guides 97 and 114 are aligned on the same plane with each other but are positioned from a center axis, such as center axis 126, at different distances, resulting in an offset position relative to each other. Center axis 126 is shown projected along the middle of length 128 of enclosure assembly 98. Alignment guide 97 is positioned at the middle of length 128 on bottom cover plate 102, while alignment guide 114 is offset from alignment guide 97 at a distance D1 from middle the middle of length 128.

Figure 1D:
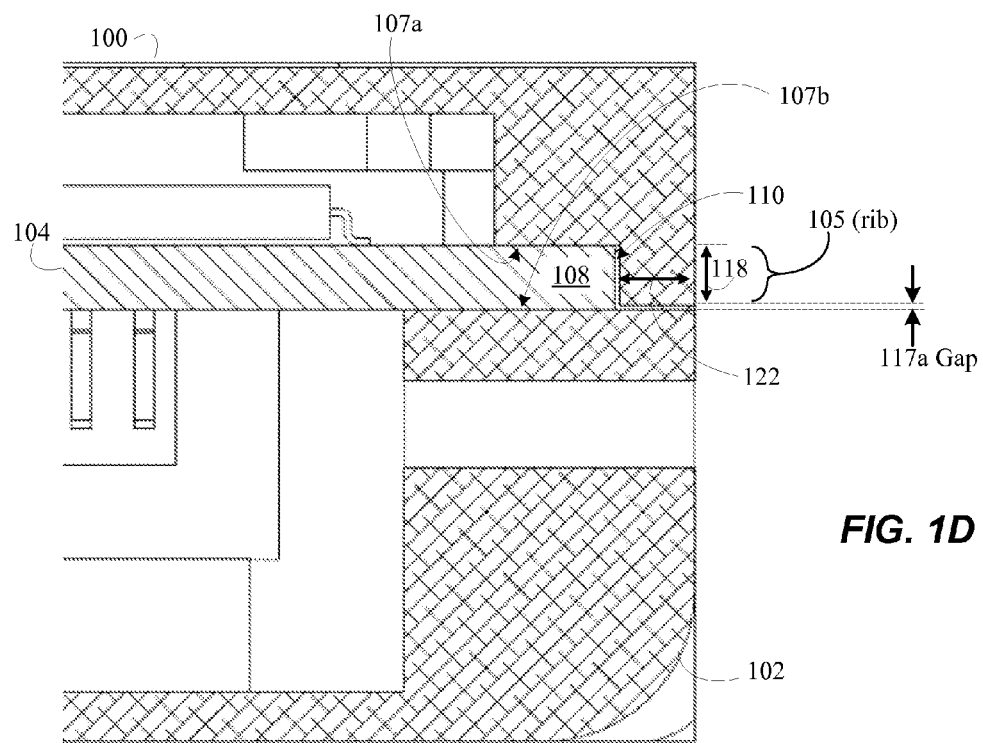
FIG. 1D is section D-D in FIG. 1C.
Figure 1H:
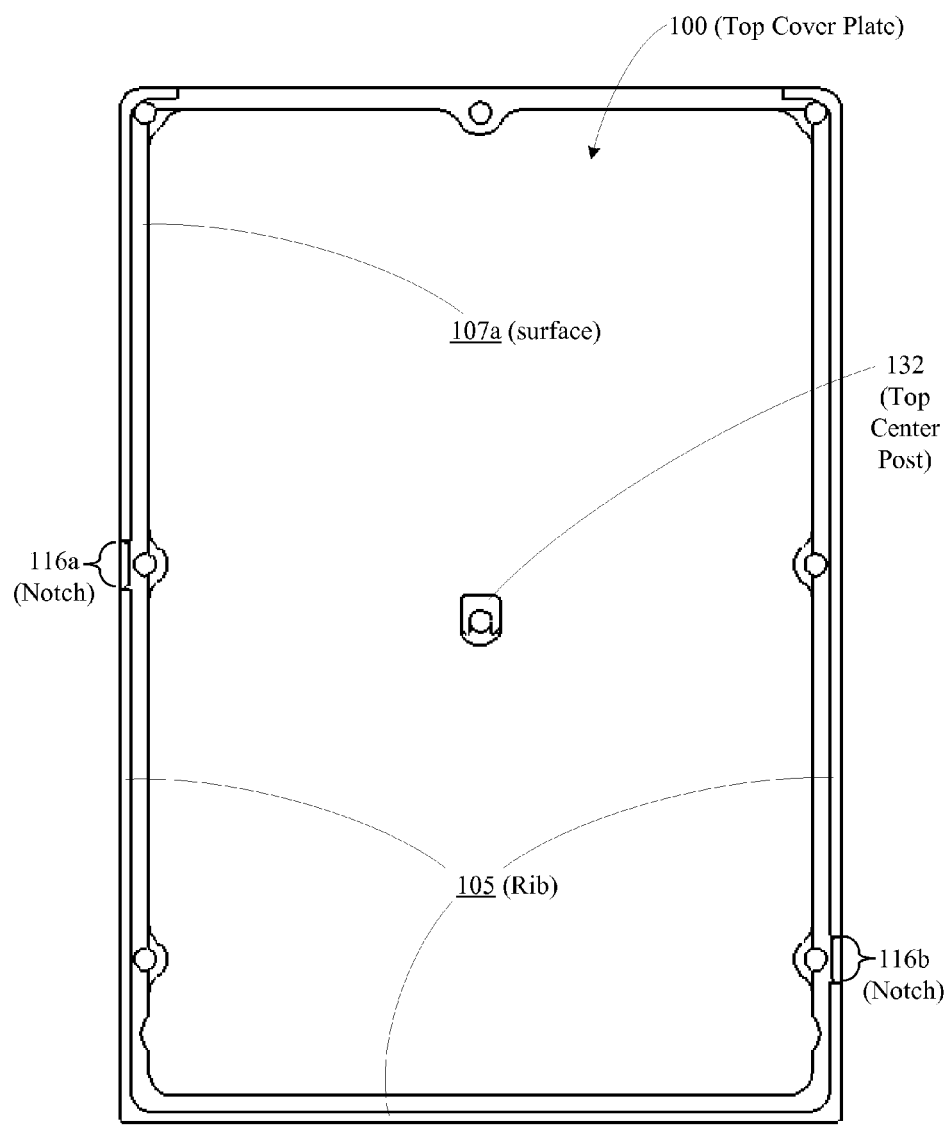
FIG. 1H is a bottom view of the top cover plate (milled version) comprising an enclosure portion used in FIGS. 1A-1D above.
Figure 1I:
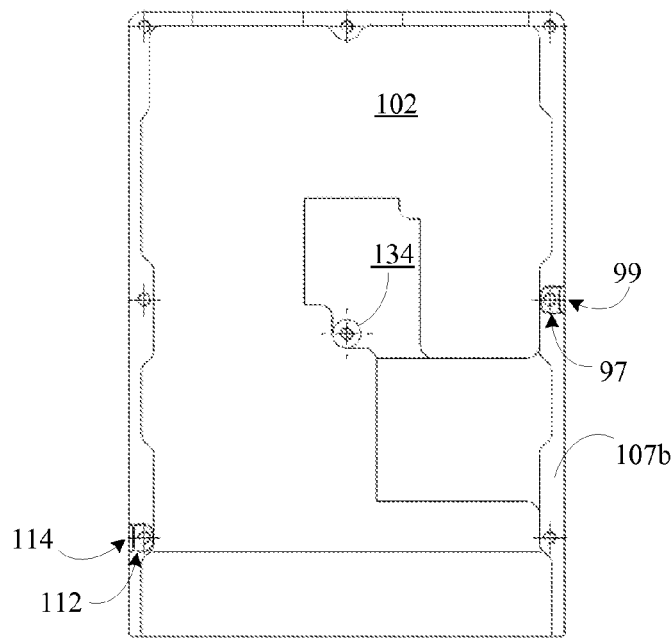
FIG. 1I is a top view of the bottom cover plate comprising an enclosure portion used in FIGS. 1A-1D above.

In accordance with yet a further embodiment of the present invention in FIG. 1D, rib 105 is formed so that it has a rib extension length 118 that extends from surface 107a. Rib extension length 118 is selected so that the circuit board portion 108 is coupled between surfaces 107a and 107b during assembly. For instance, if rib extension length 118 is disposed to have a length that is less than the mean thickness of circuit board portion 108, surfaces 107a and 107b will contact and hold circuit board portion 108. Besides contacting and holding circuit board portion 108, surfaces 107a and 107b dampen vibration forces imparted on circuit board 104. In one embodiment of the present invention, which is not intended to be limit the present invention in any way, rib extension length 118 is selected to have a length that is equal to the distance between surfaces 107a and 107b when circuit board portion 108 is coupled between these surfaces subtracted by the absolute value of the negative tolerance used to manufacture circuit board portion 108. For example, if circuit board portion 108 is manufactured to be within the tolerance of +/−0.13 mm and the distance between surfaces 107a and 107b is 2 mm when coupled to circuit board portion 108, then rib extension length 118 may be disposed to have a length of 2 mm minus 0.13 mm, which is equal to 1.87 mm. Using a rib extension length 118 that is less than the distance between surfaces 107a and 107b creates a gap 117a.

Rib extension length 118 also protects circuit board 104 from electronic disturbance due to electro-static discharge (ESD), electro-magnetic interference (EMI), or both. Rib 105 may be also coupled to an electrical ground (not shown) used by circuit board 104 to further increase this electronic disturbance protection. Further still, rib 105 further stiffens top cover plate 100, which further minimizes mechanical disturbance due to vibration which may be transferred circuit board 104.

Figure 1J:
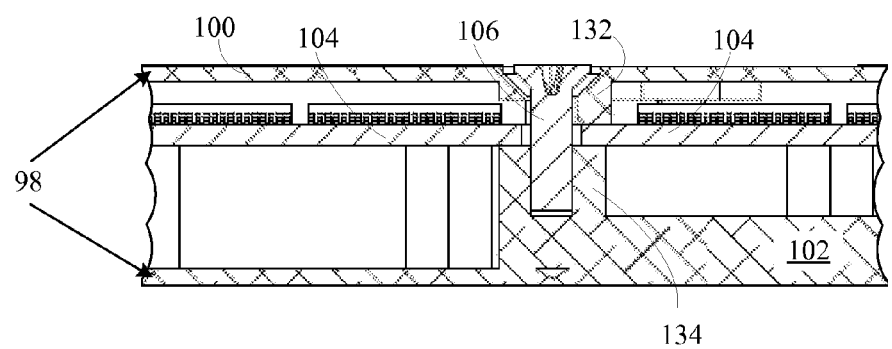
FIG. 1J is partial view of section 3-3 in FIG. 1A.

In addition and referring to FIG. 1F and FIGS. 1H-1J, top cover plate 100 and bottom cover plate 102 are provided with top center post 132 and bottom center post 134, respectively, while circuit board 104 includes a board aperture 136. Top and bottom center posts 132 and 134 are located approximately within the respective centers of top and bottom cover plates 100 and 102. The location of board aperture 136 is selected so that when circuit board 104 is coupled between top and bottom cover plates 100 and 102 during assembly as previously described, top and bottom center posts 132 and 134 and board aperture 136 are in-line with each other so that a fastener of sufficient length, such as 106, couples top cover plate 100 with bottom cover plate 102 and passes through board aperture 136 as illustrated in FIG. 1J. Providing top and bottom center posts 132 and 134 further stabilizes circuit board 104 from mechanical disturbance, such as vibration, although this functional advantage provided by these center posts is not intended to limit the scope of the present invention.

Figure 2A:
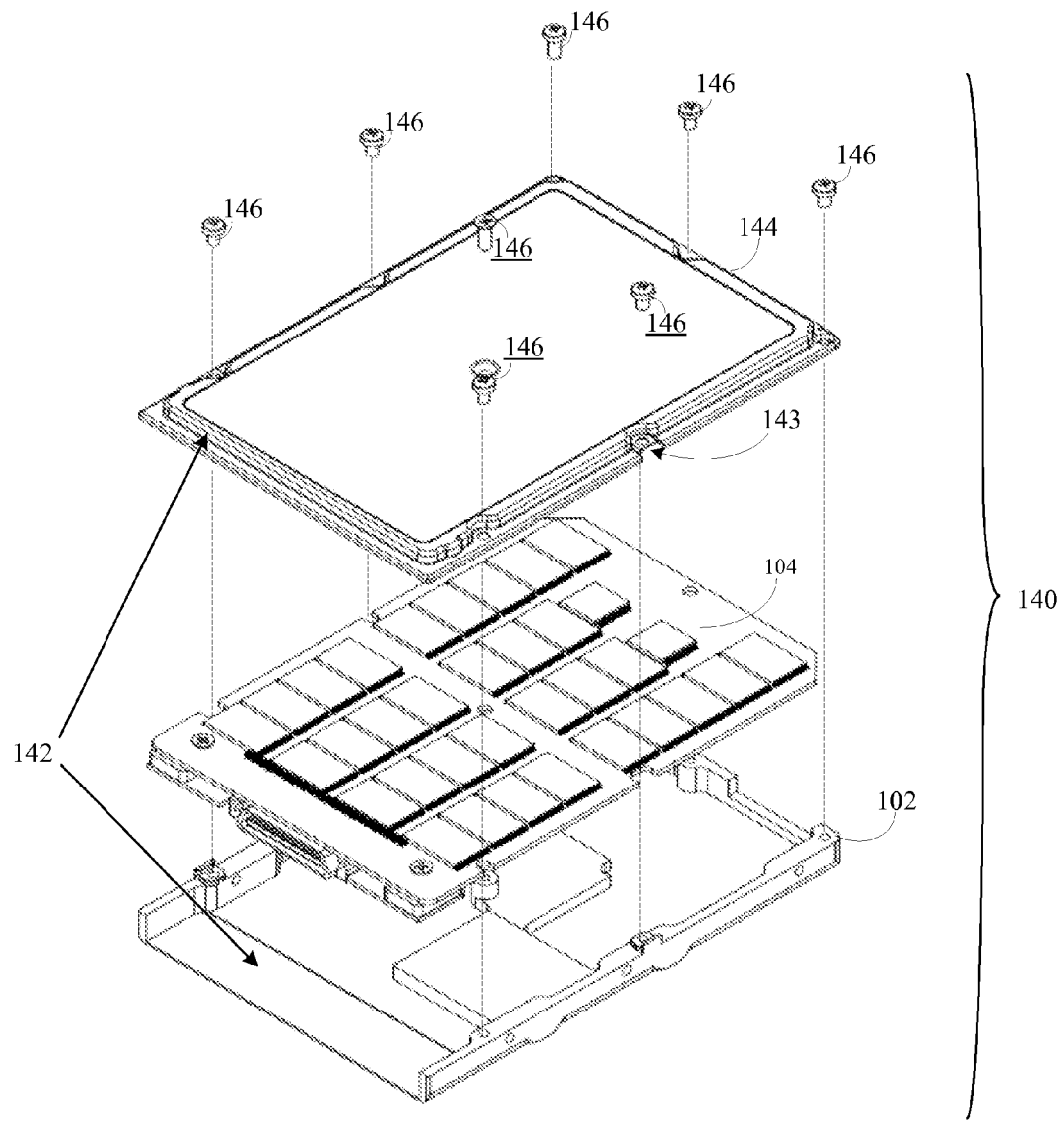
FIG. 2A is a perspective view of a SSD that is substantially similar to the improved enclosure assembly disclosed in FIG. 1-H except the improved enclosure assembly employs a top cover plate that may be formed using a stamping manufacturing process in accordance with another embodiment of the present invention.
Figure 2B:
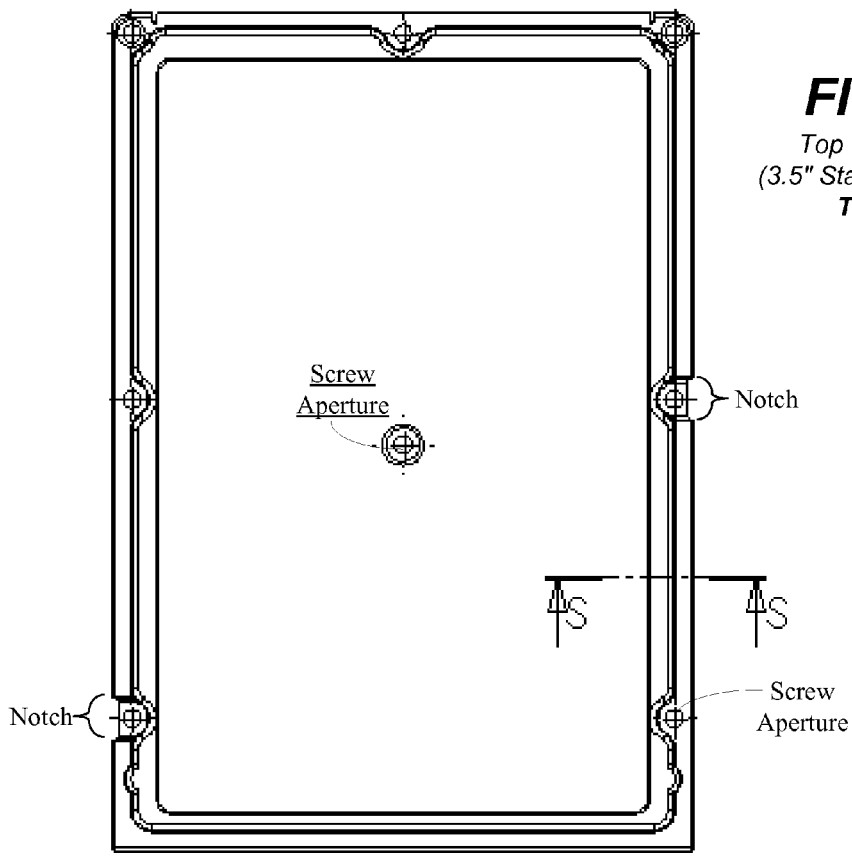
FIG. 2B is a top view of the top cover plate shown in FIG. 2A.
Figure 2C:
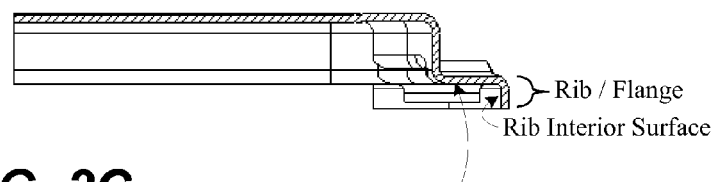
FIG. 2C is section S-S in FIG. 2B.
Figure 2D:
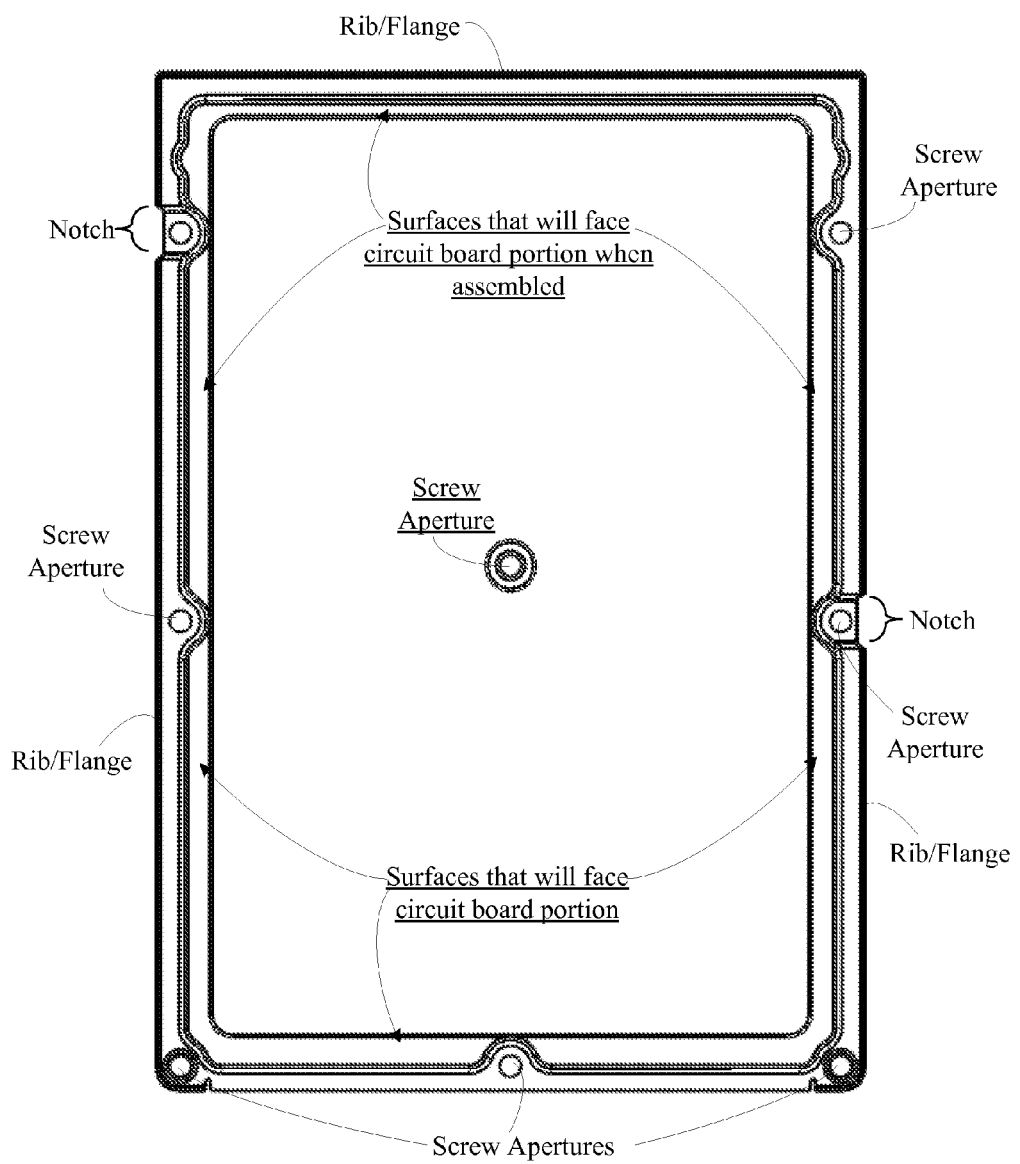
FIG. 2D is a bottom view of the stamped top cover plate shown in FIGS. 2A-2B.
Figure 2E:
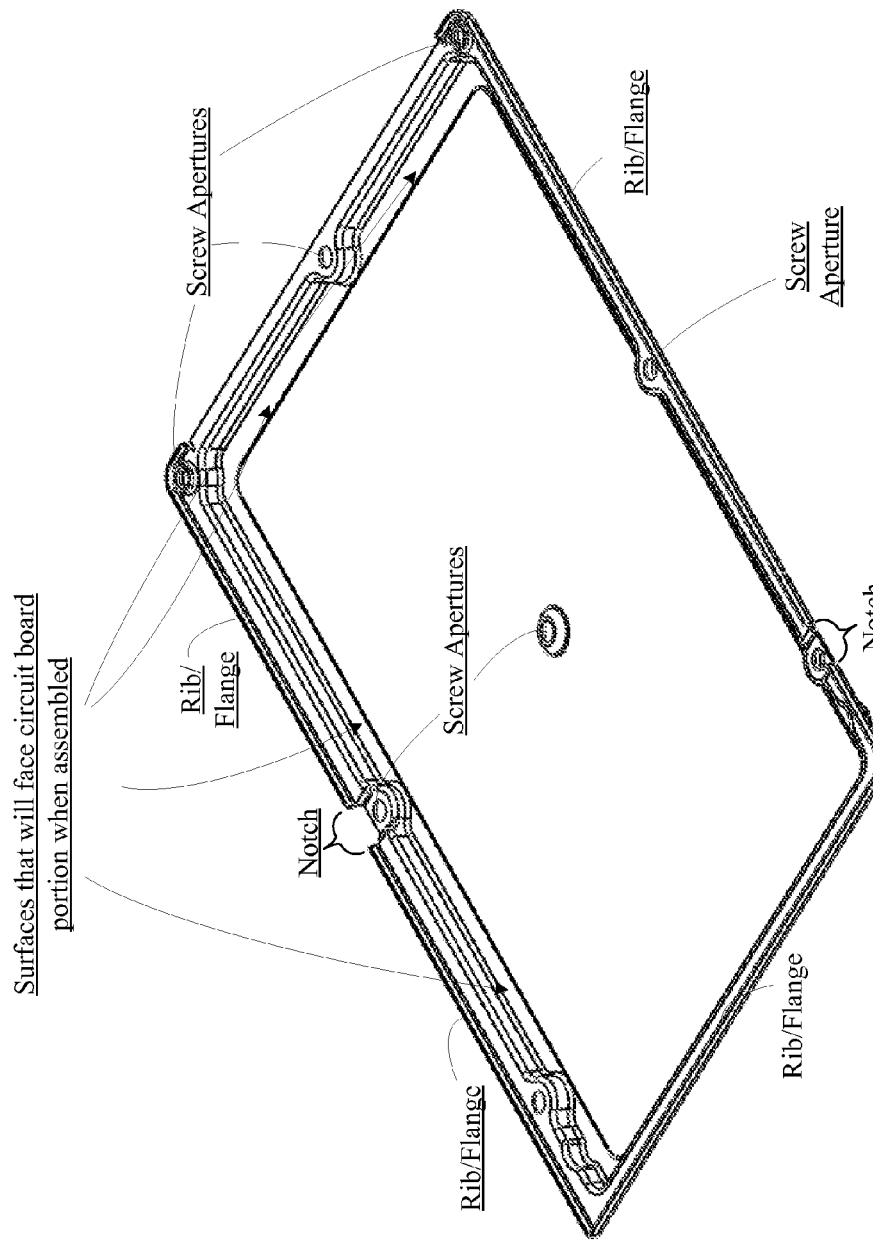
FIG. 2E is a bottom perspective view of the stamped top cover plate shown in FIGS. 2A-2B and FIG. 2D.

The portions comprising enclosure assembly 98, such as top and bottom cover plates 100 and 102, may be formed by using a variety of manufacturing processes, and may be milled, die-casted, stamped, injection-molded (plastic), and the like. In addition, the design of enclosure assembly 98 permits the interchange of parts that have been formed using different manufacturing processes. As seen in FIG. 2A for example, a SSD 140 that includes an improved enclosure assembly 142 having enclosure portions that have been formed using different manufacturing processes. One enclosure portion is formed by stamping, such as stamped top cover plate 144, while the other enclosure portion is formed by die-casting, such as bottom cover plate 102. SSD 140 is substantially similar to SSD 98 except SSD 98 is shown using an enclosure assembly that employs a stamped top cover plate 144, and fasteners sized to compensate for the different any difference in thickness between stamped cover plate 144 and top cover plate 100. For example, screws 146 are used to fasten stamped cover plate 144 to bottom cover plate 102 and have screw lengths that are suitable for coupling to bottom cover plate 102 when SSD 140 is fully assembled. Stamped cover plate 144 includes notches that receive and interlock with the tabs of bottom cover plate 102, such as tabs 99 and 114 illustrated also in FIG. 1B and FIGS. 1E-I. Additional views of stamped cover plate 144 are provided in FIGS. 2B-2E

Figure 3:
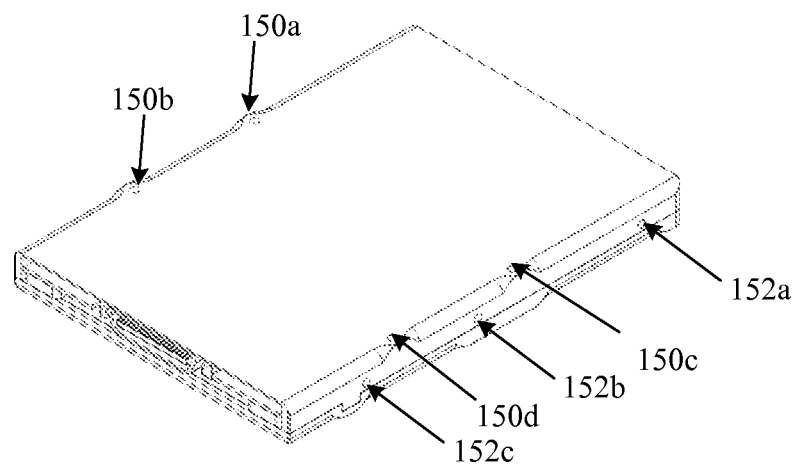
FIG. 3 is a perspective view of the mounting positions to which fasteners may be applied to couple a 3.5 inch HDD form factor compliant SSD to a computer, storage appliance case in accordance with yet another embodiment of the present invention.

FIG. 3 is a perspective view of the mounting positions to which fasteners may be applied to couple a 3.5 inch HDD form factor compliant SSD, such as SSD 96 or 140 above, to a computer or storage appliance case in accordance with yet another embodiment of the present invention. SSD 96 or 140 includes mounting positions that comply with the HDD form factor selected for enclosure assembly 98. For instance enclosure assembly 98 includes mounting positions 150a-150d that are located on the bottom surface of bottom cover plate 102 and mounting positions 152a-152c on the sides of bottom cover plate 102. Bottom cover plate 102 also includes additional mounting positions disposed on the other side of bottom cover plate 102 but are not illustrated in this figure due to its perspective view.

Figure 4A:
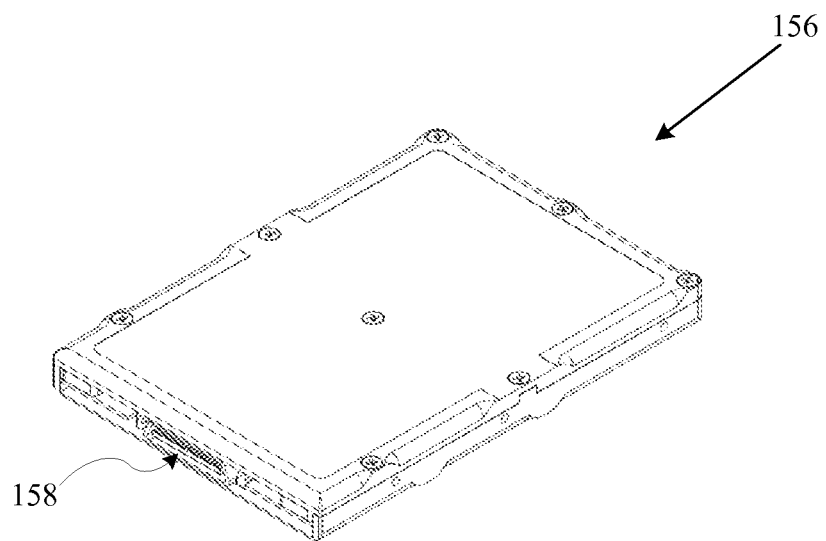
FIG. 4A is a perspective view of a 3.5 inch HDD form factor compliant SSD that has an improved enclosure assembly and that is configured with a fibre channel interface connector in accordance with yet another embodiment of the present invention.
Figure 4B:
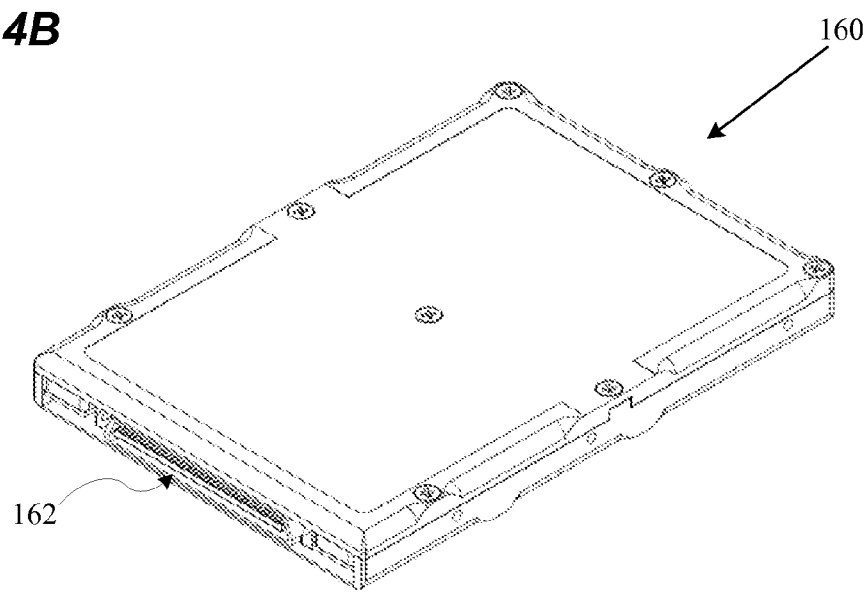
FIG. 4B is a perspective view of a 3.5 inch HDD form factor compliant SSD that has an improved enclosure assembly and that is configured with a SCSI U320 channel interface connector in accordance with yet another embodiment of the present invention.
Figure 4C:
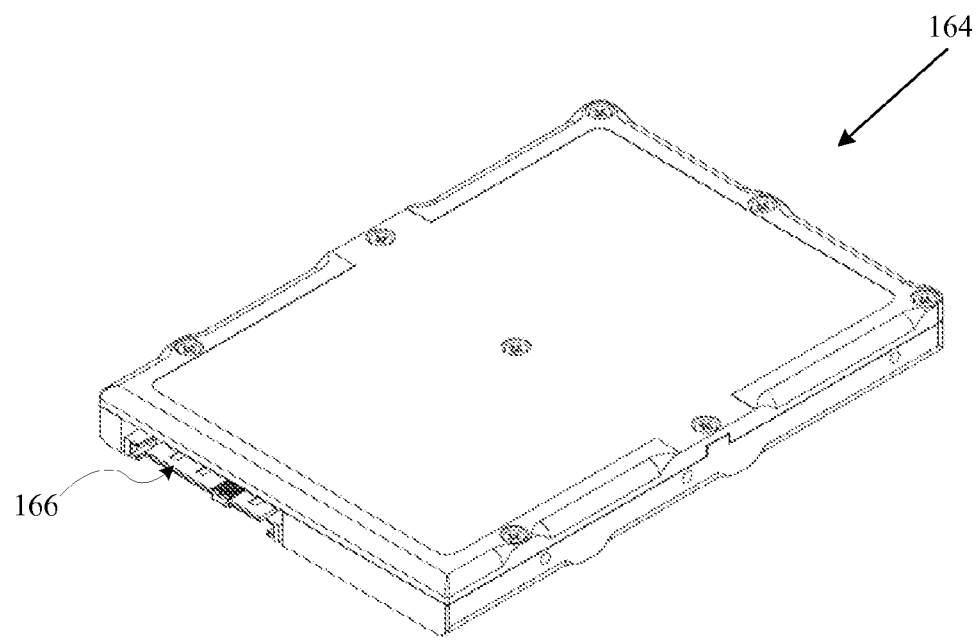
FIG. 4C is a perspective view of a 3.5 inch HDD form factor compliant SSD that has an improved enclosure assembly substantially and that is configured with a SATA channel interface connector in accordance with yet another embodiment of the present invention.

FIG. 4A is a perspective view of a 3.5 inch HDD form factor compliant SSD 156 that has an improved enclosure assembly substantially similar to enclosure assembly 98 above, but is configured with a fibre channel interface connector 158 in accordance with yet another embodiment of the present invention. FIG. 4B is a perspective view of a 3.5 inch HDD form factor compliant SSD 160 that has an improved enclosure assembly substantially similar to enclosure assembly 98 above, but is configured with a SCSI U320 channel interface connector 162 in accordance with yet another embodiment of the present invention. FIG. 4C is a perspective view of a 3.5 inch HDD form factor compliant SSD 164 that has an improved enclosure assembly substantially similar to enclosure assembly 98 above, but is configured with a SATA channel interface connector 166 in accordance with yet another embodiment of the present invention. The present invention is not limited to a particular type of interface connector, including those shown herein, but may be any interface connector that is compatible with the interface protocol used by the SSD manufactured. For instance, the SSDs disclosed herein may have other types of interface connectors, such as PATA, iSCSI, and the like.

Figure 5:
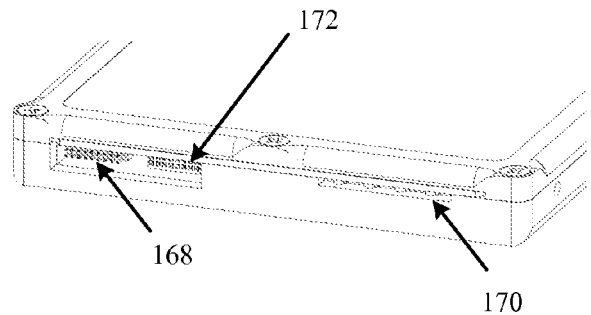
FIG. 5 is a partial perspective view of a 3.5 inch HDD form factor compliant SSD that a jumper header, an LED display and a system connector in accordance with yet another embodiment of the present invention.

FIG. 5 is a partial perspective view of a 3.5 inch HDD form factor compliant SSD, such as SSD 96 or 140 above, that includes a jumper header 168, an LED display 170 and a system connector 172 in accordance with yet another embodiment of the present invention. Jumper header 168 may be used to set and monitor signals sent to LED display 170, while system connector 172 may be used to provide firmware upgrades to the SSD.

2.5" Single Stack Embodiment

FIGS. 6A-6B illustrate a SSD 196 that includes a single circuit board 204 and an improved enclosure assembly 198 that complies with the 2.5" HDD standard form factor in accordance with another embodiment of the present invention. This embodiment may also be herein referred to as a SSD having a single-stack 2.5 inch form factor compliant SSD enclosure assembly. Enclosure assembly 198 includes a set of enclosure portions, such as a top cover plate 200 and a bottom cover plate 202, which are disposed to interlock and stack with each other as well as receive circuit board 204. Top cover plate 200 includes a rib 205 which is located on the perimeter of top cover plate 200. Rib 205 provides additional stiffness to top cover plate 200. Bottom cover plate 202 is disposed with an alignment guide 197, but unlike bottom cover plate 102 above, bottom cover plate is configured without a tab in this particular example. Circuit board 204 is coupled between top and bottom cover plates 200 and 202, which are fastened together by suitable fasteners, such as a set of six flat head screws 206. When assembled, top and bottom cover plates 200 and 202 form enclosure assembly 198 and result in a SSD having at least one circuit board, such as circuit board 204, that is received within an enclosure assembly that complies with a standard HDD form factor. Enclosure assembly 198 is disposed to receive circuit board 204 within rib 205 and to distribute mechanical stress across enclosure assembly 198. Enclosure assembly 198 complies with the 2.5 inch HDD form factor although the present invention is not intended to be limited to this particular form factor and other form factors may be used.

Figure 6I:
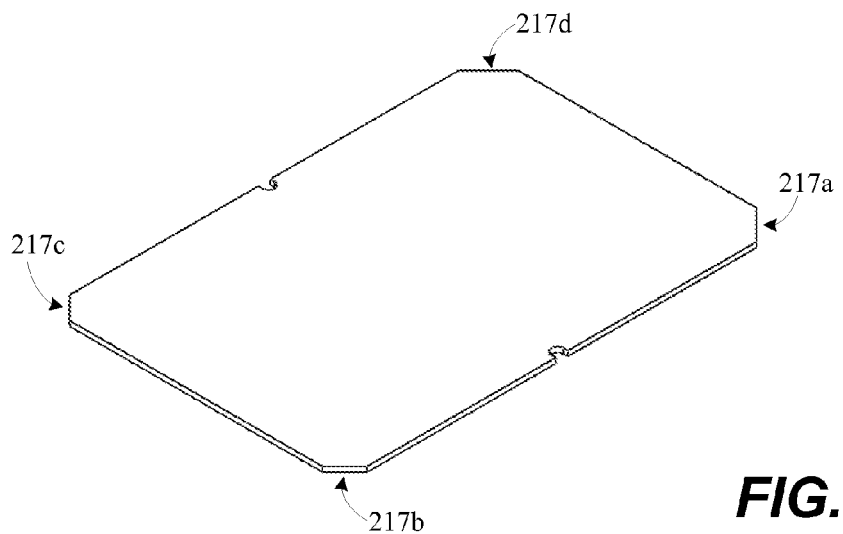
FIG. 6I is a perspective view of the outline shape of a circuit board used for the embodiment disclosed in FIG. 6A.
Figure 6C:
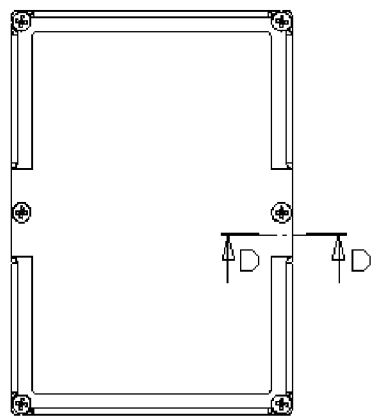
FIG. 6C is a top view of the SSD illustrated in FIGS. 6A-6B.
Figure 6D:
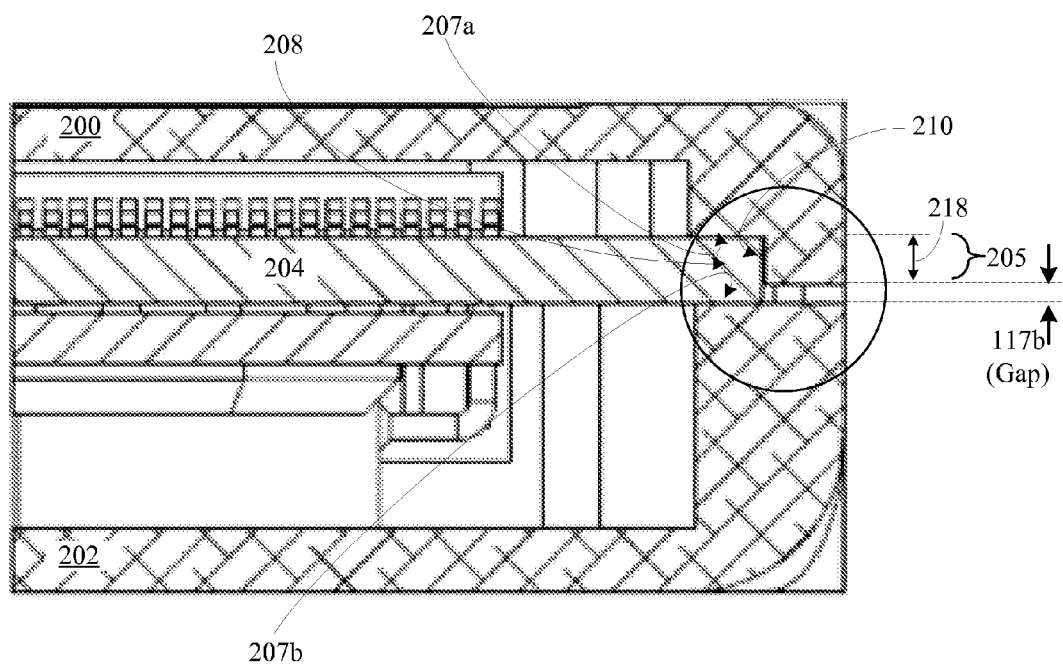
FIG. 6D is a cross-sectional view of section D-D in FIG. 6C.
Figure 6E:
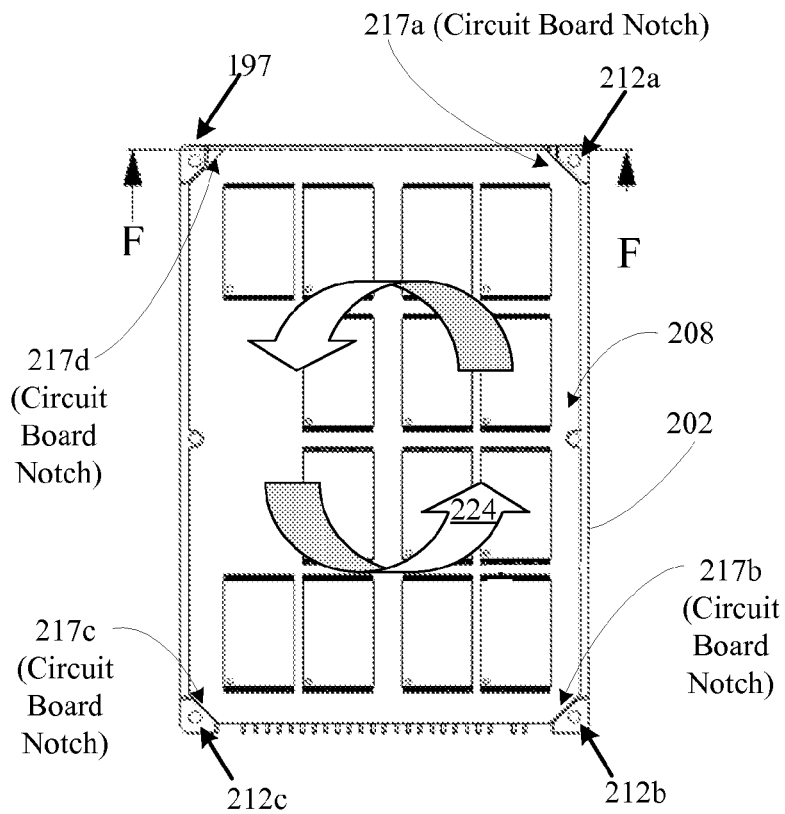
FIG. 6E is a top view of the embodiment disclosed in FIG. 6A with the top cover plate removed.
Figure 6F:
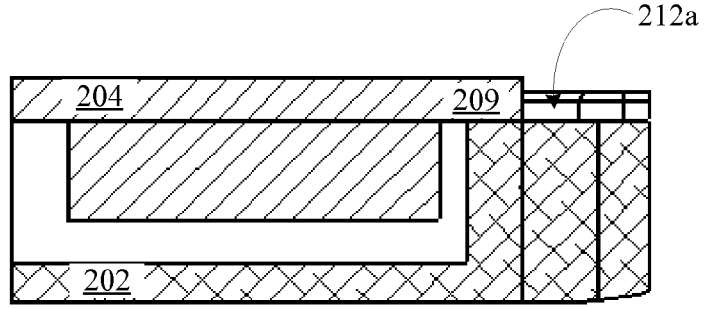
FIG. 6F is cross-sectional view of section F-F in FIG. 6C.
Figure 6H:
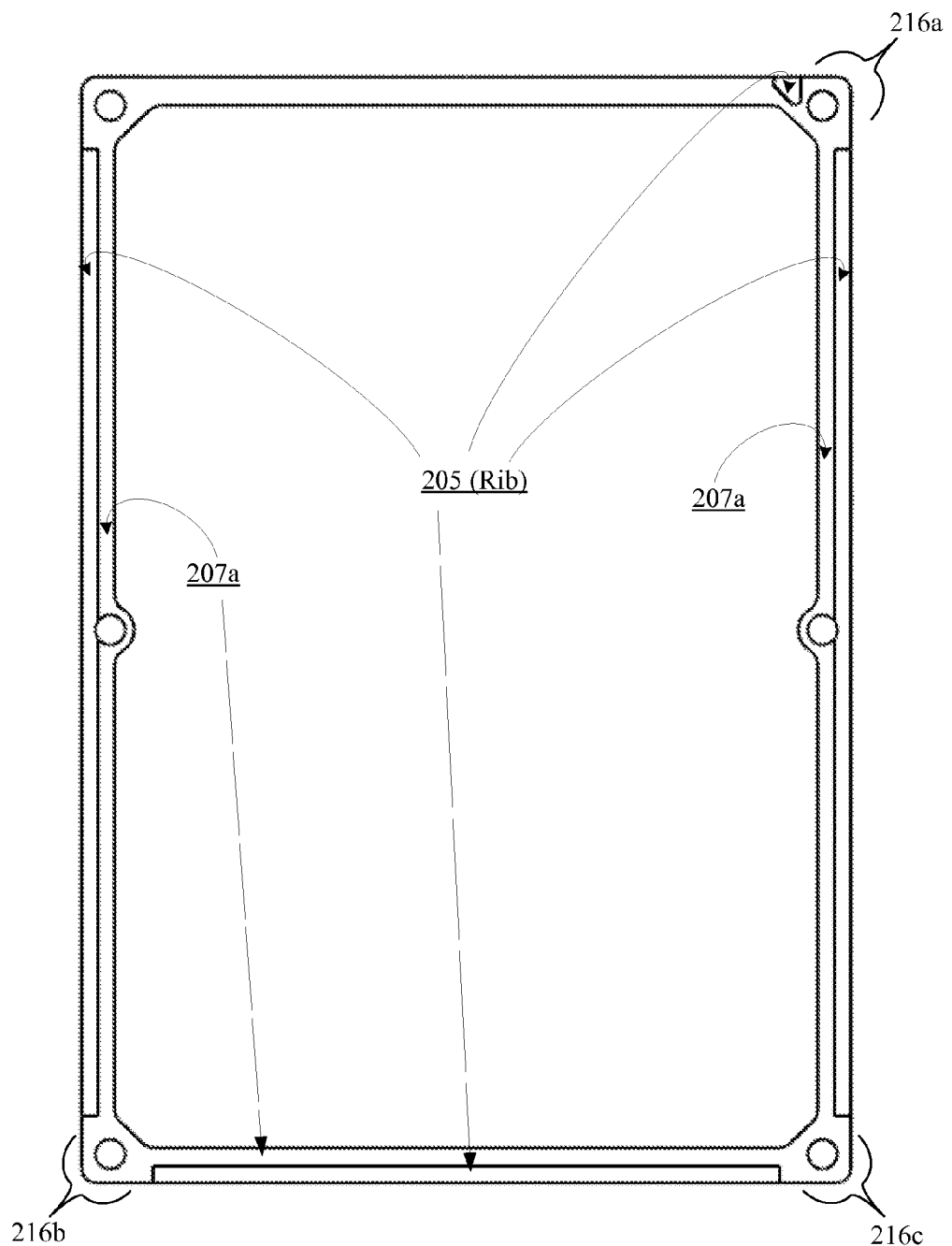
FIG. 6H is a bottom view of the 2.5" top cover plate comprising an enclosure portion used in FIGS. 6A-6D.

In FIGS. 6B, 6D, 6G and 6H, top and bottom cover plates 200 and 202 include surfaces 207a and 207b, respectively. When assembled to form SSD 196, and in FIG. 6D specifically, a perimeter edge portion 208 of circuit board 204 is coupled to and located between two enclosure portions of enclosure assembly 198. In FIG. 6B, perimeter edge portion 208 is coupled to surfaces 207a and 207b and is located adjacent to an interior rib surface 210 of rib 205. In FIGS. 6B and 6E, in addition to alignment guide 197, additional alignment guides 212a-212c are also used although the number of alignment guides used to interlock and stack at least two enclosure portions is not intended to be limiting in any way. In addition, as seen in FIGS. 6B, 6C and 6H, rib 205 includes notches, such as 216a-216c, for receiving the alignment guides included on bottom cover plate 202. Notches 216a-c are formed on a surface of and into rib 205 so that they form voids for receiving their respective alignment guides, such as alignment guides 197 and 212a-c, respectively. The number of notches formed on rib 205 is not intended to be limiting although the number of notches formed equals the number of tabs used in the embodiment shown. Moreover, the shape of the tabs and notches are also not intended to limit the scope and spirit of the invention disclosed.

Alignment guides 197 and 212a-c each have a height that extends through and exceeds the thickness of perimeter edge portion 209. As shown in FIGS. 6B, 6E-6F and 6I, the positions of alignment guides 197 and 212a-c on bottom cover plate 202 are selected so that a circuit board disposed with circuit board notches 217a-217d can be received within alignment guides 197 and 212a-c, enabling the circuit board to is also contact surface 207b of bottom cover plate 202.

Alignment guides 197 and 212a-c, notches 21a-c of top cover plate 200, and rib 205 form an interlocking and stacking mechanism that permits enclosure portions to be stacked together. In addition, when fastened together and used to receive and enclose circuit board 204, this interlocking and stacking mechanism distributes mechanical stress, such as torsion, across the enclosure portions of enclosure assembly 198, reducing the amount of disruptive or damaging mechanical stress that might otherwise be transmitted to circuit board 204.

In addition, alignment guide 197 has a shape, dimension, or both that is different than the shape, dimension, or both of at least one of the alignment guides, such as 216a-216c to prevent circuit board 204 from being coupled between surfaces 207a and 207b in the wrong orientation. This also prevents a circuit board with matching circuit board notches, such as circuit board 204, from being coupled between surfaces of enclosure portions, such as surfaces 207a and 207b in the wrong orientation 224, resulting in a "foolproof" assembly of SSD 196.

Referring specifically to FIG. 6D, in accordance with yet a further embodiment of the present invention, rib 205 is formed so that it has a rib extension length 218 that extends from surface 207a. Rib extension length 218 is selected so that circuit board portion 208 is coupled between surfaces 207a and 207b during assembly. For instance, if rib extension length 218 is disposed to be less than the mean thickness of circuit board portion 108, surfaces 207a and 207b will contact and hold circuit board portion 208. Besides contacting and holding circuit board portion 208, surfaces 207a and 207b dampen vibration forces imparted on circuit board 204. In one embodiment of the present invention, which is not intended to be limit the present invention in any way, rib extension length 218 is selected to have a length that is equal to the distance between surfaces 207a and 207b when circuit board portion 208 is coupled between these surfaces subtracted by the absolute value of the negative tolerance used to manufacture circuit board portion 208. For example, if circuit board portion 208 is manufactured to be within the tolerance of +/−0.13 mm and the distance between surfaces 207a and 207b is 2 mm when coupled to circuit board portion 208, then rib extension length 218 may be disposed to have a length of 2 mm minus 0.13 mm, which is equal to 1.87 mm. Using a rib extension length 218 that is less than the distance between surfaces 207a and 207b creates a gap 117b.

Rib extension length 218 also protects circuit board 204 from electronic disturbance due to electro-static discharge (ESD), electro-magnetic interference (EMI), or both. Rib 205 may be also coupled to an electrical ground (not shown) used by circuit board 204 to further increase this electronic disturbance protection. Further still, rib 205 further stiffens top cover plate 200, which further minimizes mechanical disturbance due to vibration which may be transferred circuit board 204.

Figure 7:
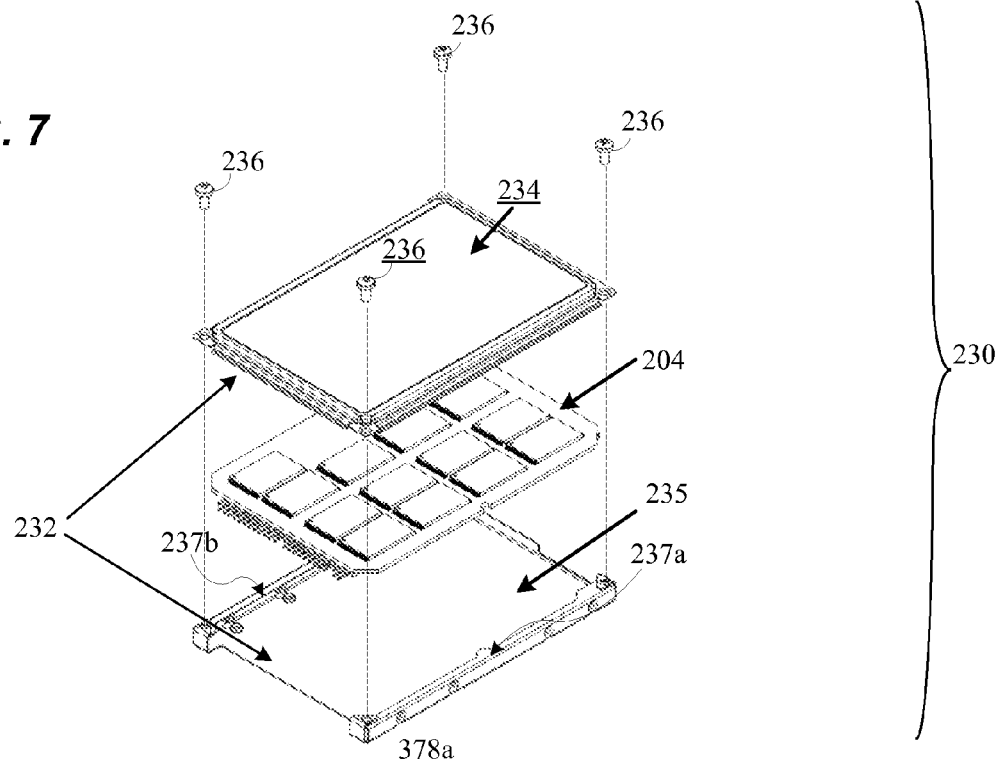
FIG. 7 is a perspective illustration of a SSD that includes an improved enclosure assembly having enclosure portions that may be formed by using a stamping manufacturing process in accordance with yet another embodiment of the present invention.

The portions comprising enclosure assembly 198, such as top and bottom cover plates 200 and 202, may be formed by using a variety of manufacturing processes, and may be milled, die-casted, stamped, injection-molded (plastic), and the like. In addition, the design of enclosure assembly 198 permits the interchange of parts that have been formed using different manufacturing processes. As seen in FIG. 7 for example, a SSD 230 includes an improved enclosure assembly 232 having stamped enclosure portions. Both top cover plate 234 and bottom cover plate 235 are manufactured using a manufacturing process that includes stamping. Bottom cover plate 235 includes a flanges 237a-b disposed on at least two sides of its perimeter so that at two respective side edges of top cover plate 234 are received within the inside facing surfaces of flanges 237a and 237b. SSD 230 is substantially similar to SSD 196 except SSD 230 is shown using an enclosure assembly that employs a stamped top and bottom cover plates 234 and 235, and fasteners that are have sized to compensate for the different any difference in thickness between stamped cover plate 234 and top cover plate 200. For example, screws 236 are used to fasten stamped top cover plate 234 to bottom cover plate 235, and screws 236 have screw lengths that are suitable for coupling to top cover plate 234 to bottom cover plate 235.

Figure 8:
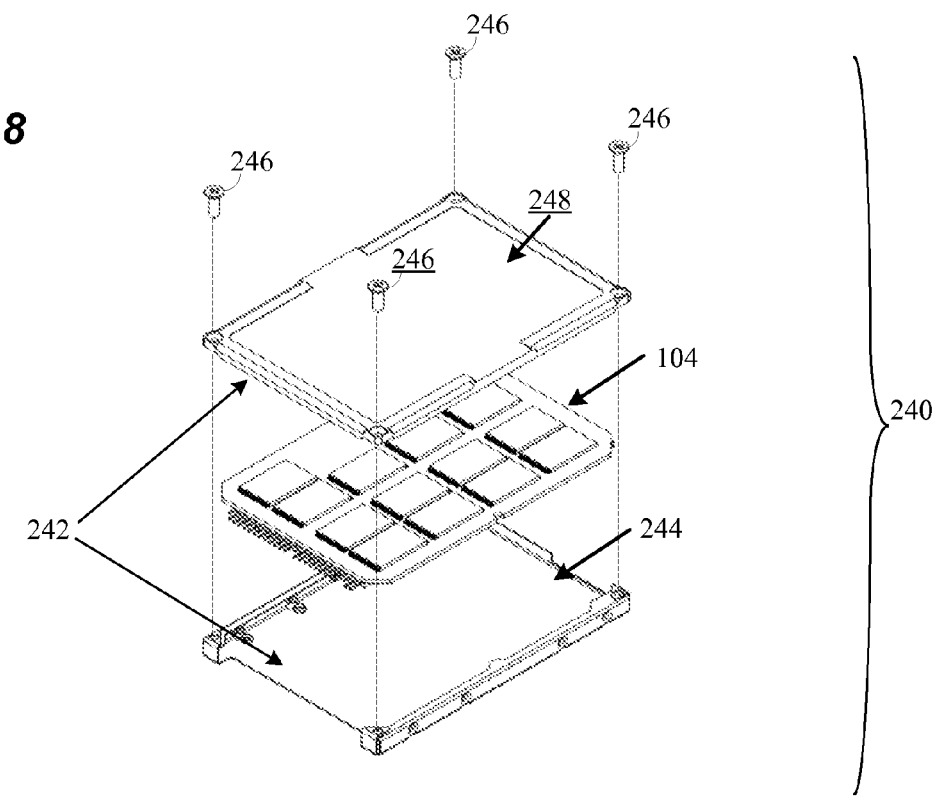
FIG. 8 is a perspective illustration of a SSD that includes an improved enclosure assembly having enclosure portions that have been formed using different manufacturing processes in accordance with yet another embodiment of the present invention.

FIG. 8 illustrates a SSD 240 that includes an improved enclosure assembly 232 having enclosure portions that have been formed using different manufacturing processes. One enclosure portion is formed by stamping, such as stamped bottom cover plate 244; while the other enclosure portion is formed by die-casting, such as top cover plate 200. SSD 240 is substantially similar to SSD 196 except SSD 240 is shown using an enclosure assembly that employs a stamped bottom cover plate 244 and fasteners that are have sized to compensate for the different any difference in thickness between stamped bottom cover plate 244 and top cover plate 200. For example, screws 246 are used to fasten top cover plate 200 to stamped bottom cover plate 244. Screws 246 have screw lengths that are suitable for coupling top cover plate 200 to bottom cover plate 244. Top cover plate 248 is substantially similar to top cover plate 200 disclosed with respect to FIGS. 6A-6D, while bottom cover plate 244 is substantially similar to bottom cover plate 235 disclosed with respect to FIG. 7.

Figure 9:
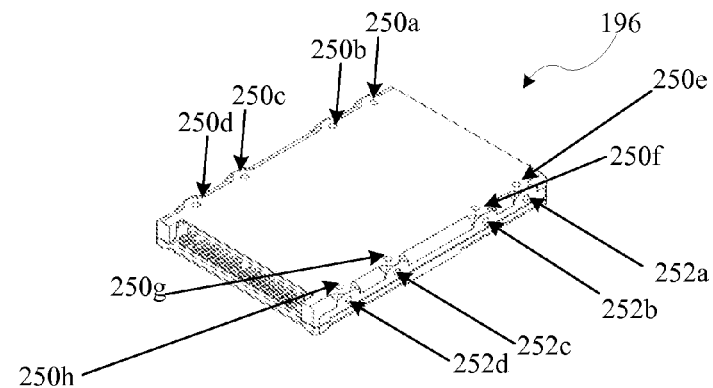
FIG. 9 is a perspective view of the mounting positions to which fasteners may be applied to couple a 2.5 inch HDD form factor compliant SSD with a computer or storage appliance case in accordance with yet another embodiment of the present invention.

FIG. 9 is a perspective view of the mounting positions to which fasteners may be applied to couple a 2.5 inch HDD form factor compliant SSD, such as SSD 196 above, with a computer or storage appliance case in accordance with yet another embodiment of the present invention. SSD 196 includes mounting positions that comply with the HDD form factor selected for enclosure assembly 198. For instance enclosure assembly 198 includes mounting positions 250a-250h that are located on the bottom surface of bottom cover plate 202 and mounting positions 252a-252d on the sides of bottom cover plate 202. Bottom cover plate 202 also includes additional mounting positions disposed on the other side of bottom cover plate 202 but are not illustrated in this figure due to its perspective view.

Figure 10A:
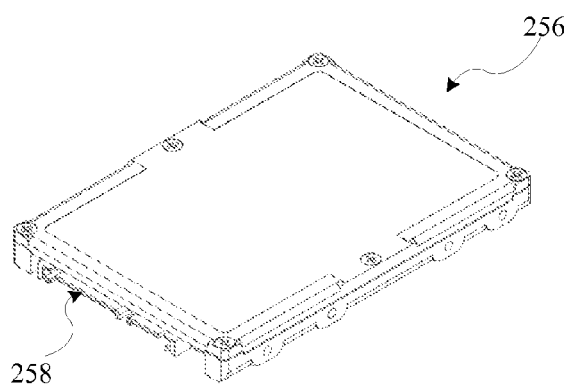
FIG. 10A is a perspective view of a 2.5 inch HDD form factor compliant SSD that has an improved enclosure assembly and a SATA interface connector in accordance with yet another embodiment of the present invention.
Figure 10B:
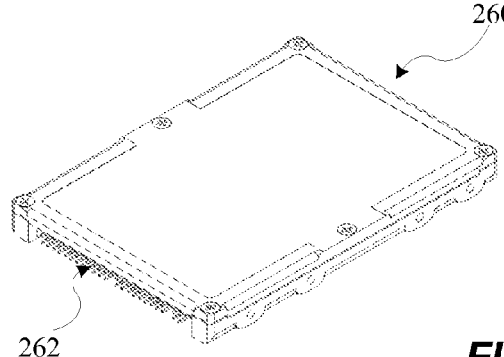
FIG. 10B is a perspective view of a 2.5 inch HDD form factor compliant SSD that has an improved enclosure assembly and a PATA interface connector in accordance with yet another embodiment of the present invention.

FIG. 10A is a perspective view of a 2.5 inch HDD form factor compliant SSD 256 that has an improved enclosure assembly substantially similar to enclosure assembly 198 above, but is configured with a SATA interface connector 258 in accordance with yet another embodiment of the present invention. FIG. 10B is a perspective view of a 2.5 inch HDD form factor compliant SSD 260 that has an improved enclosure assembly substantially similar to enclosure assembly 198 above, but is configured with a PATA interface connector 262 in accordance with yet another embodiment of the present invention.

Figure 11:
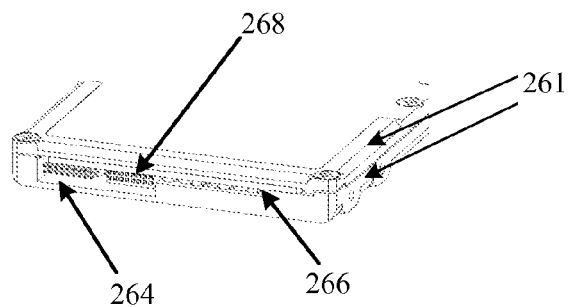
FIG. 11 is a partial perspective view of a 2.5 inch HDD form factor compliant SSD having an enclosure assembly having voids for providing access to at least one connector and an LED display in accordance with yet another embodiment of the present invention.

FIG. 11 is a partial perspective view of a 2.5 inch HDD form factor compliant SSD, such as SSD 196 or 230 above, that has an enclosure assembly 261 having openings for providing access to a jumper header 264, an LED display 266 and a system connector 268 in accordance with yet another embodiment of the present invention. Jumper header 264 may be used to set and monitor signals sent to LED display 266, while system connector 268 may be used to provide firmware upgrades to the SSD.

3.5 Inch Two-Stack Implementation Generally

Although the above examples refer to single circuit board SSDs that comply with the 3.5 inch or 2.5 inch HDD form factors, these SSDs are not intended to be limited to such single circuit board examples and may be modified to include additional circuit boards in accordance with another embodiment of the present invention. For instance, FIGS. 12A-12F disclose various inventive concepts relating to a 3.5 inch HDD form factor compliant SSD 280 that has an enclosure assembly 286 that can support more than one circuit board, such as circuit boards 282 and 284. Enclosure assembly 286 is similar to enclosure assembly 98 or 142 supporting a single circuit board SSD, such as SSD 96 or 140, which complies with the 3.5 inch HDD form factor disclosed previously above. Enclosure assembly 286 includes enclosure portions comprising top cover plate 300 and bottom cover plate 302. Top and bottom cover plates 300 and 302 are substantially similar to those disclosed with respect to enclosure assemblies 98 and 142, such as top cover plate 100 or 144 and bottom cover plate 102. For instance, top cover plate 300 includes a rib 304 having an interior surface 310, notches 316a and 316b, a top center post 332, and a surface 307a which are substantially similar to rib 105, interior surface 110, notches 116a and 116b, top center post 132 and surface 107a, respectively, of top cover plate 100 previously disclosed above. Bottom cover plate 302 includes alignment guides 311 and 312, tabs and a bottom center post 334, and a surface 307b, which are respectively and substantially similar to alignment guides 97 and 112, tabs 99 and 114, bottom center post 134, and surface 107b previously disclosed above. Unlike enclosure assembly 98 or 142, however, enclosure assembly 286 further comprises a spacer 288.

Figure 12A:
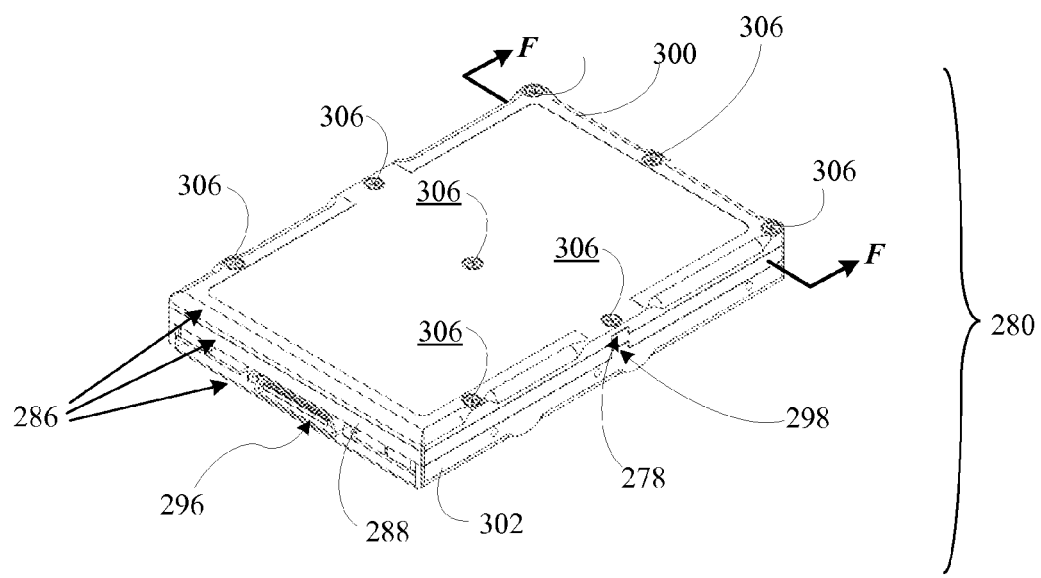
FIG. 12A is a perspective illustration of a SSD that includes more than one circuit board and an improved enclosure assembly which complies with the 3.5" HDD standard form factor in accordance with yet another embodiment of the present invention.
Figure 12B:
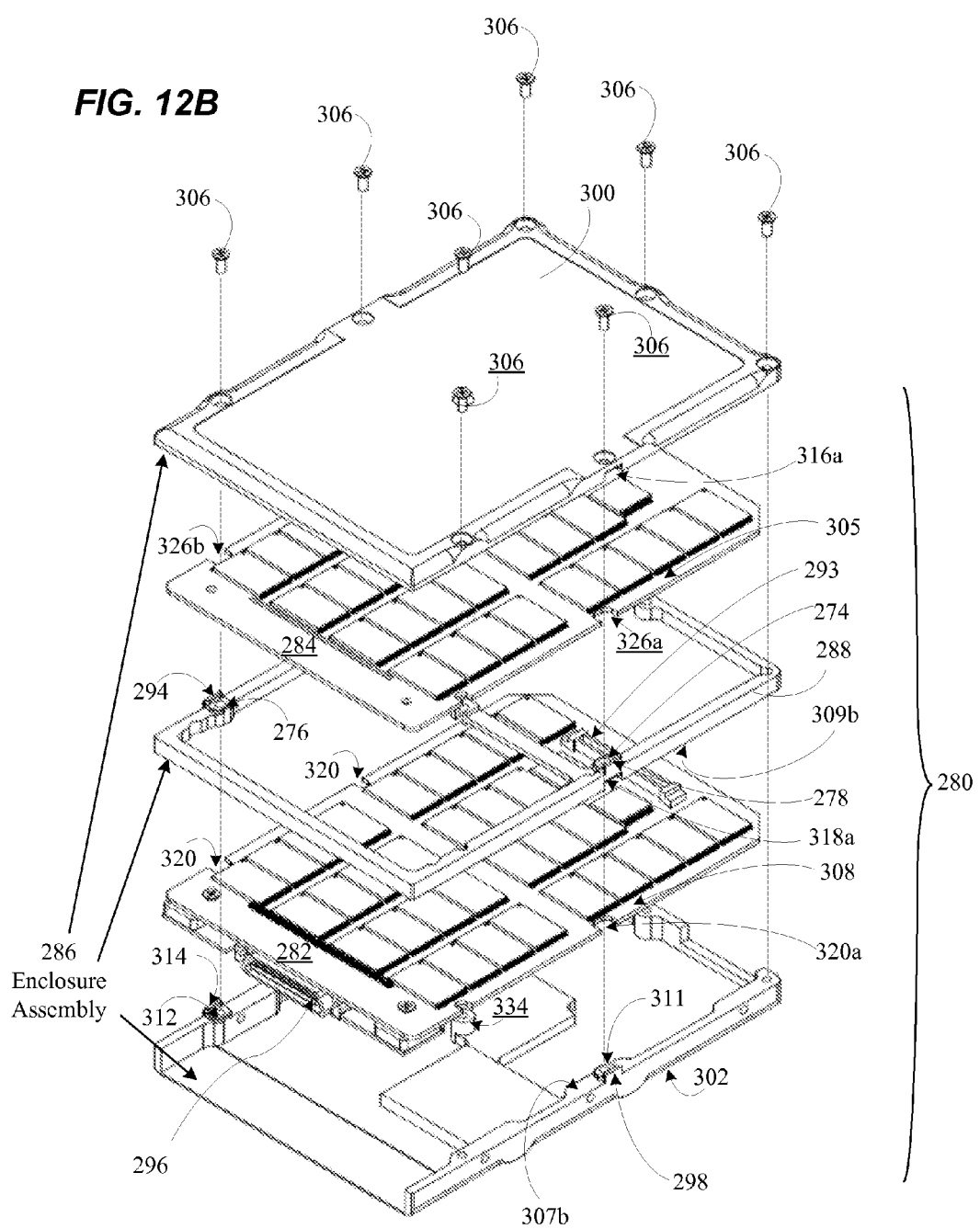
FIG. 12B is an exploded view of the embodiment disclosed in FIG. 12A.
Figure 12C:
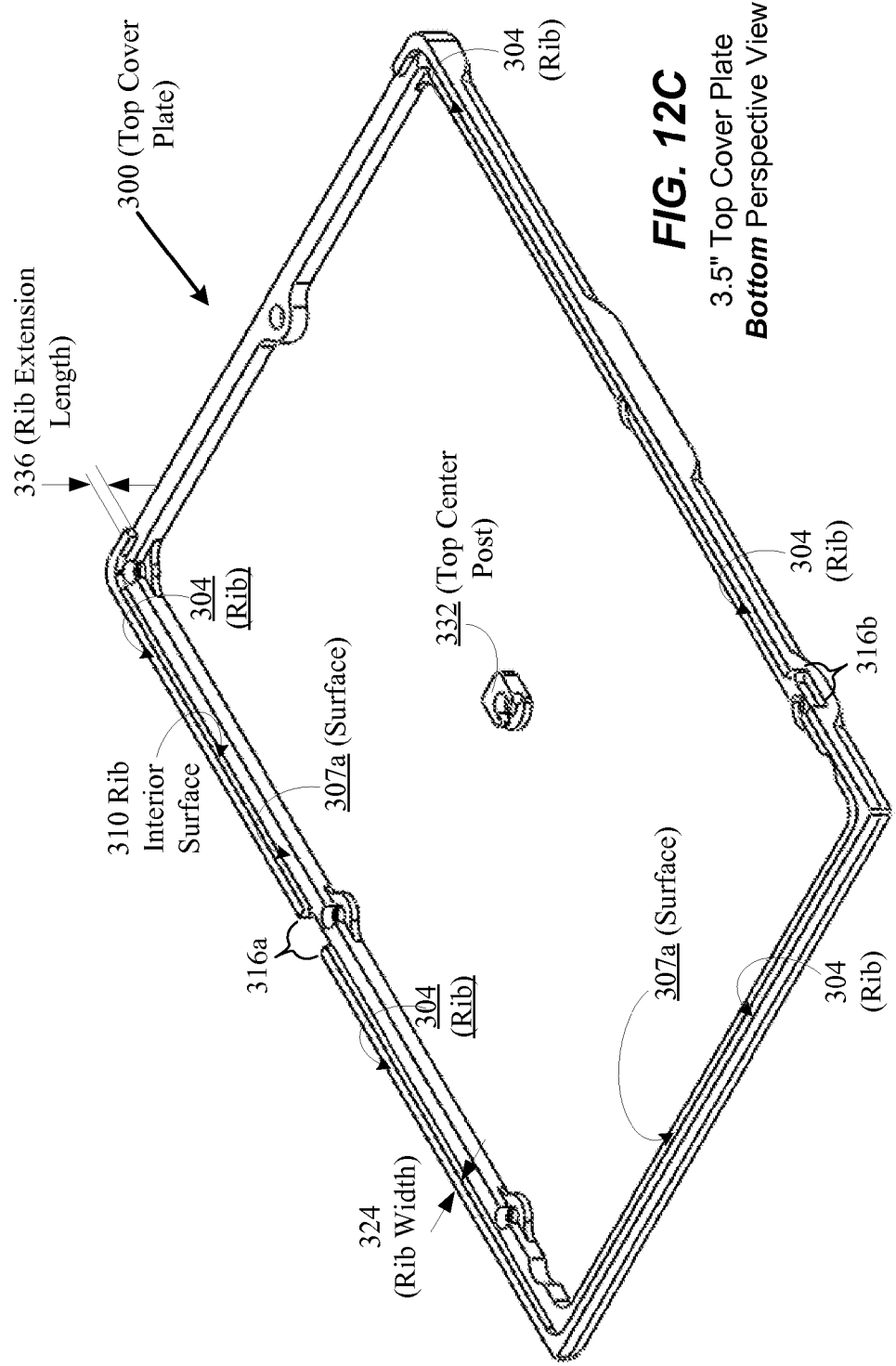
FIG. 12C is a bottom perspective view of the top cover plate illustrated in FIG. 12A.
Figure 12D:
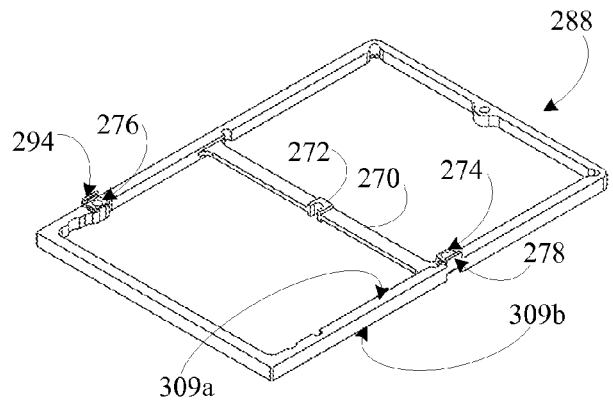
FIG. 12D is a top perspective view of the disclosed in FIG. 12A.
Figure 12G:
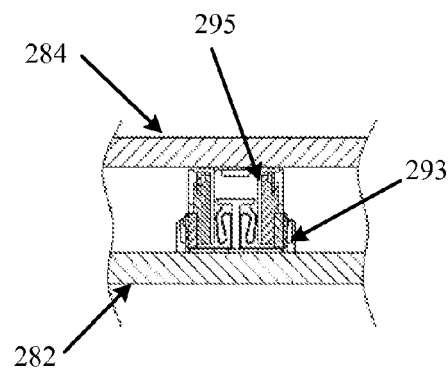
FIG. 12G is a partial cross sectional view of section F-F of FIG. 12A of the circuit boards that include board-to-board connectors.
Figure 12E:
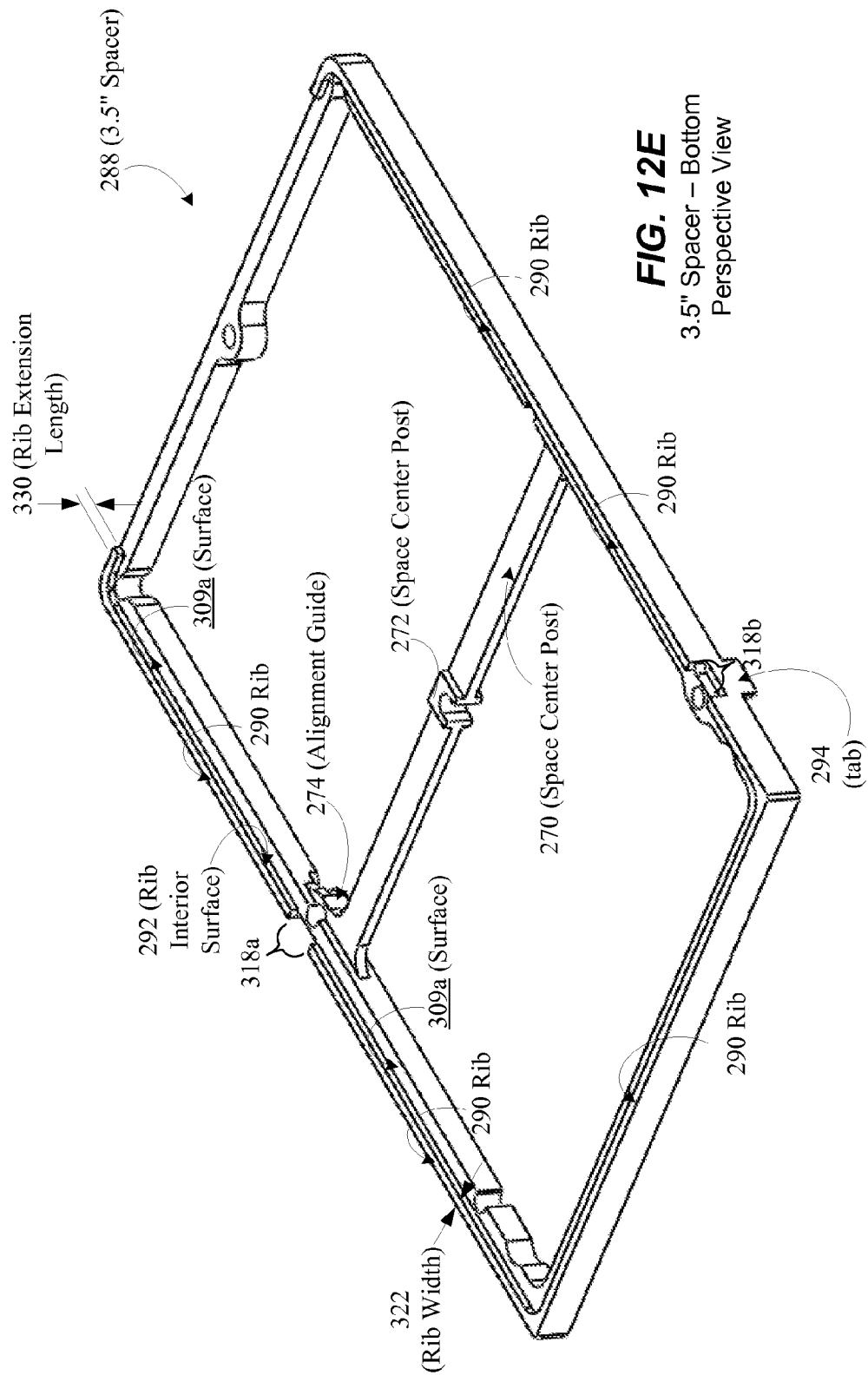
FIG. 12E is a bottom perspective view of the spacer disclosed in FIG. 12D.

Spacer 288, top cover plate 300 and a bottom cover plate 302 are disposed to interlock and stack with each other as well as receive circuit boards 282 and 284. As illustrated in FIGS. 12B, 12D, and 12E, spacer 288 includes a cross-member 270, spacer center post 272, alignment guides 274 and 276, tabs 278 and 294, a rib 290, an interior rib surface 292, and surfaces 309a and 309b. The number of alignment guides and tabs provided or disposed on spacer 288 is not intended to be limiting, although in the embodiment shown, the number of alignment guides and tabs used on spacer 288 is respectively equal to the number of alignment guides and tabs selected for top and bottom cover plates 300 and 302.

Figure 12F:
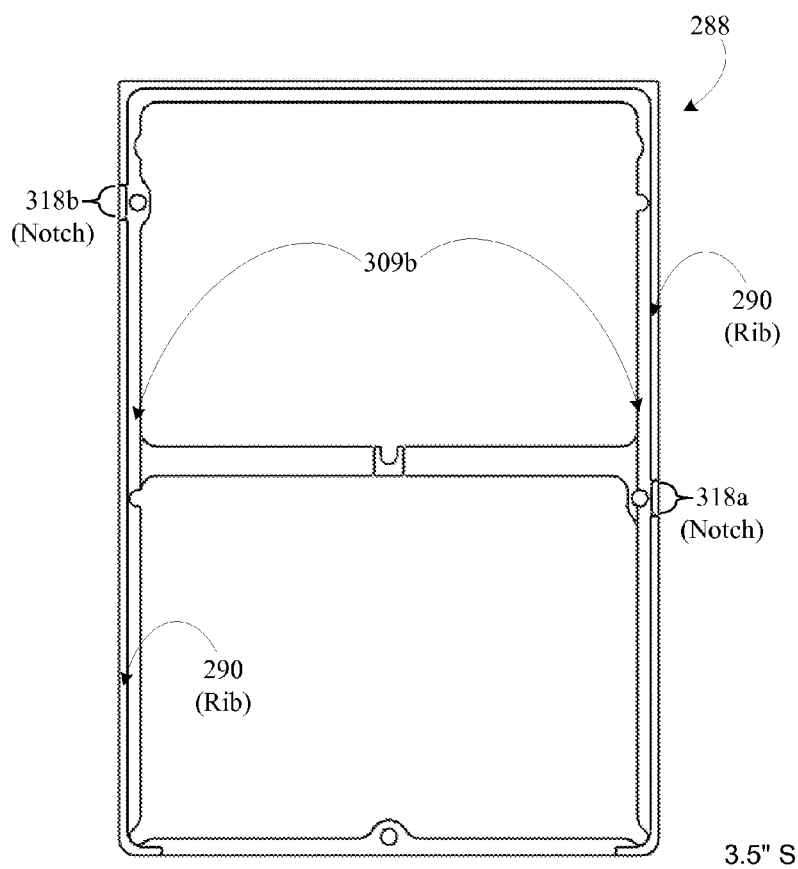
FIG. 12F is a bottom view of the spacer disclosed in FIG. 12E.

Rib 290 is located on the perimeter of spacer 288 and provides additional stiffness to spacer 288. Circuit board 282 is coupled between bottom cover plate 302 and one side of spacer 290, while circuit board 284 is coupled between top cover plate 300 and another side of spacer 288. Circuit boards 282 and 284, spacer 288, top cover plate 300 and bottom cover plate 302 are fastened together by suitable fasteners, such as a set of eight flat head screws 306. When assembled, spacer 288, and top and bottom cover plates 300 and 302 form enclosure assembly 286 and result in a SSD having at least two circuit boards, such as circuit boards 282 and 284, received within an enclosure assembly that complies with the 3.5 inch standard HDD form factor. The electrical components disposed on circuit boards 282 and 284 may be any components necessary to enable SSD 280 to function as a storage device. For instance, as illustrated in FIGS. 12A-12B and FIG. 12F, circuit board 282 includes memory devices, such as NAND flash, a controller integrated circuit for controlling these memory devices, and an interface connector 296, and a board-to-board connector 295. Circuit board 284 may be used as a memory expansion board and may include additional memory components and a board-to-board connector 293 that can electrically couple to board-to-board connector 295.

When assembled to form SSD 280, perimeter edge portion 308 of circuit board 282 and perimeter edge portion 305 of circuit board 284 are each coupled to and located between two enclosure portions of enclosure assembly 286. In the example shown in FIGS. 12A-B, perimeter edge portion 308 is coupled to and located between bottom cover plate 302 at surface 307b and spacer 288 at surface 309b, while perimeter edge portion 305 is coupled to and located between top cover plate 300 at surface 307a and spacer 288 at surface 309a. Perimeter edge portion 308 is adjacent to interior rib surface 292 of rib 290 when circuit board 305 is placed between bottom cover plate 302 and spacer 288. Perimeter edge portion 305 is adjacent to interior rib surface 310 of rib 304 when circuit board 284 is placed between top cover plate 300 and spacer 288.

The stacking of spacer 288, top cover plate and bottom cover plate involves the use of notches and tabs. Rib 290 includes notches 318a and 318b for receiving tabs 298 and 314, respectively, and rib 304 includes notches 316a and 316b for receiving tabs 278 and 294. In the particular example shown in FIGS. 12B, 12C, 12E, and 12I, notches 316a-316b and 318a-318b are each respectively formed on a surface of and into ribs 290 and 304, and have a depth that does not exceed rib widths 322 and 324, creating voids for receiving tabs 274 and 294 and tabs 298 and 314, respectively. The number of notches formed on ribs 290 and 304 is not intended to be limiting. Moreover, the shape of the tabs and notches are also not intended to limit the scope and spirit of the invention disclosed.

Alignment guides 274 and 276 and alignment guides 311 and 312 each have a height that extends through and exceeds the thickness of perimeter edge portions 284 and 308, respectively. As shown in FIGS. 12B-12D, the positions of alignment guides 274 and 276 that are disposed on spacer 288, and alignment guides 311 and 312 that are disposed on bottom cover plate 302, are selected so circuit board notches 320a-320b and circuit board notches 326a-326b respectively receive these alignment guides during assembly. Alignment guides 274, 276, 311, and 312; tabs 294, 278, 298, 314, ribs 290 and 304, and notches 316a-316b and 318a-318b collectively function as an interlocking and stacking mechanism that permits enclosure portions, such as spacer 288, top cover plate 300 and bottom cover plate 302, to be interlocked and stacked together. In addition, when fastened together and used to receive and enclose circuit boards 282 and 284, this interlocking and stacking mechanism distributes mechanical stress, such as torsion, across the enclosure portions of enclosure assembly 286, reducing the amount of disruptive or damaging mechanical stress that might otherwise be transmitted to circuit boards 282 and 284.

As a further embodiment, these alignment guides from the same enclosure portion, such as alignment guides 274 and 276 from spacer 288 or alignment guides 311-312 from bottom cover plate 302, may be positioned in an offset position relative to each other that prevents a circuit board from being coupled between enclosure portions in the wrong orientation and providing a "fool-proof" assembly of SSD 280 because this prevents a circuit board with matching notches, such as circuit board 282 or 284, from being coupled in the wrong orientation between surfaces of enclosure portions, such as surfaces 307a and 309a, or surfaces 307b and 309b, respectively.

In accordance with yet a further embodiment of the present invention, rib 290 of spacer 288 in FIG. 12E and rib 304 of top cover plate 300 in FIG. 12C are each formed so that they have rib extension length 330 and rib extension length 336, respectively. Rib extension lengths 330 and 336 respectively extend from surfaces 309a and 307a, respectively, in substantially the same manner as described for rib extension length 118 or 218 disclosed above. In addition, rib extension lengths 330 and 336 create gaps 117c, as shown in FIG. 13 below.

Rib extension lengths 330 and 336 also protect circuit boards 282 and 284 from electronic disturbance due to electro-static discharge (ESD), electro-magnetic interference (EMI), or both. Ribs 290 and 304 may be also coupled to an electrical ground (not shown) used by these circuit boards to further increase this electronic disturbance protection. Ribs 290 and 304 further stiffen spacer and top cover plate 300, respectively, which further minimizes mechanical disturbance due to vibration which may be transferred circuit boards 282 and 284.

3.5 Inch Multi-Stack Implementation Generally

Figure 13:
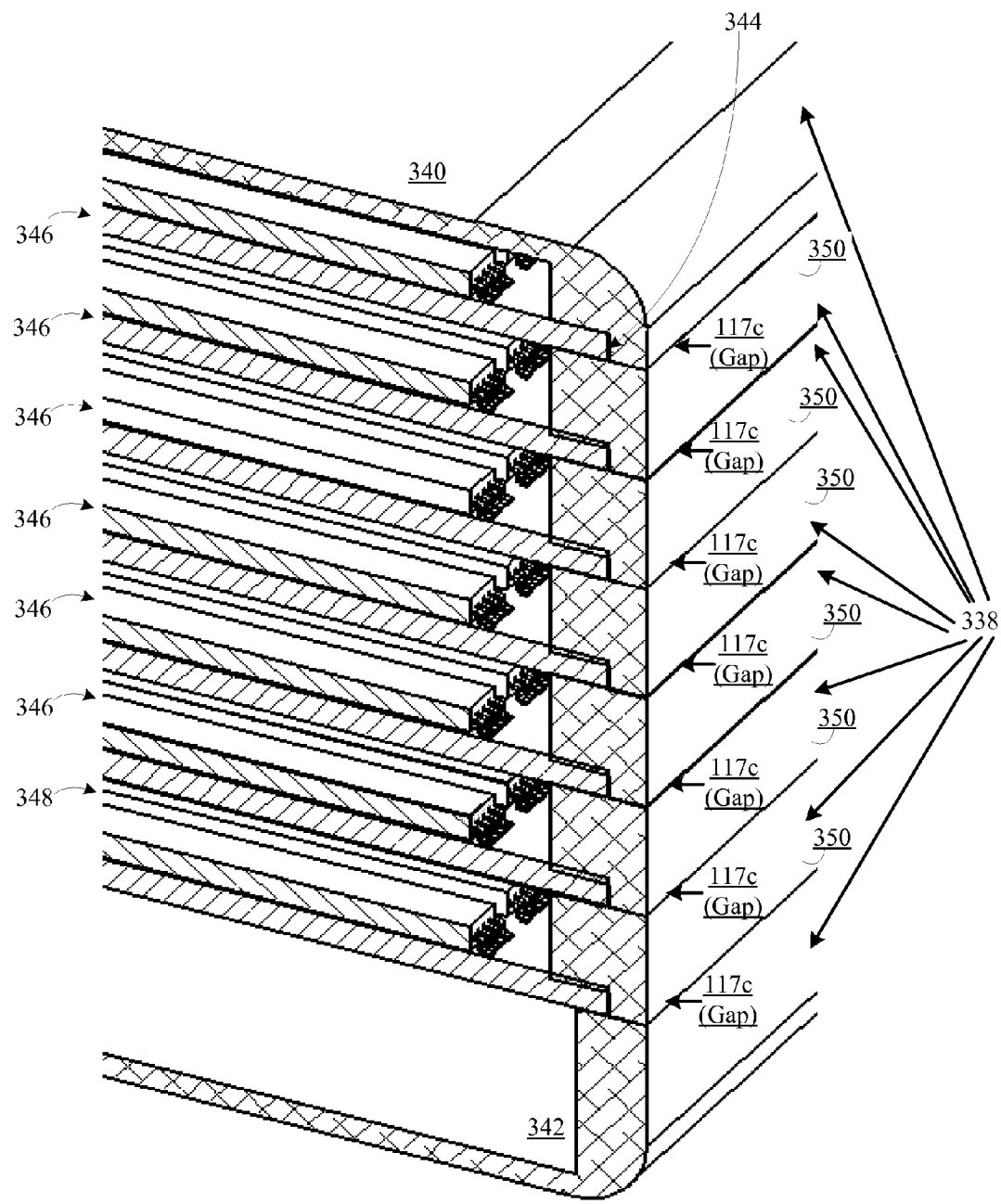
FIG. 13 is a cross-sectional perspective view of a 3.5 inch HDD form factor compliant enclosure assembly supporting more than two circuit boards in accordance with yet another embodiment of the present invention.

Referring now to FIG. 13, another embodiment of a 3.5 inch HDD form factor compliant enclosure assembly 338 supporting more than two circuit boards. This embodiment may also be herein referred to as a multi-stack 3.5 inch form factor compliant SSD enclosure assembly. Enclosure assembly 338 includes enclosure portions comprising top cover plate 340 and bottom cover plate 342, which are substantially similar to those disclosed with respect to enclosure assemblies 98, 142, or 286, such as top cover plate 100, 144 or 300, and bottom cover plate 102 or 302, disclosed previously. For instance, top cover plate 340 includes a rib 344 having an interior rib surface, at least two notches, a top center post and a surface which are respectively and substantially similar to rib 304, interior surface 310, notches 316a and 316b, top center post 332 and surface 307a of top cover plate 300. Bottom cover plate 302 includes alignment guides, tabs, a bottom center post, and a surface, which are respectively and substantially similar to alignment guides 311 and 312, tabs 298 and 314, bottom center post 334, and surface 307b previously disclosed above.

Unlike enclosure assembly 286, however, enclosure assembly 338 comprises more than one spacer, such as spacer 350. Spacer 350 is substantially similar to spacer 288 previously disclosed above with respect to FIGS. 12A-12C. Top cover plate 340, bottom cover plate 242, and multiple instances of spacer 350 are disposed to interlock and stack with each other as well as receive circuit boards 346 and 348. These circuit boards are coupled to each other through board-to-board connectors and are received by enclosure assembly 338. This board-to-board connector is not illustrated in FIG. 13 but is substantially similar to board-to-board connectors 293 and 295, previously disclosed with respect to FIG. 12F. Increasing memory capacity may be performed by interlocking and stacking an additional instance of circuit board 346 and spacer 350, while decreasing memory capacity may be performed by removing an instance of circuit board 346 and spacer 350 from enclosure assembly 338. Using screws to fasten enclosure assembly 338 requires screws of different lengths based on the number of spacers and circuit boards used. Circuit boards 346 and 348 are substantially similar to circuit board 284 and 282, respectively disclosed above with respect to FIGS. 12A and 12B. Using multiple instances of spacer 350 enables a SSD that includes enclosure assembly 238 to receive more than one circuit board disposed with memory devices, such as circuit board 346, enabling this SSD to remain suitable for mounting in systems that require 3.5" HDD form factor compliant storage devices and that can receive such storage devices but with different enclosure assembly heights.

2.5 Inch Two Stack Implementation

FIGS. 14A-14G disclose various inventive concepts relating to a 2.5 inch HDD form factor compliant SSD 358 that has an enclosure assembly 360 which can support more than one circuit board, such as circuit boards 362 and 364. Enclosure assembly 360 is similar to an enclosure assembly that supports a single circuit board SSD which complies with the 2.5 inch HDD form factor disclosed previously above. Examples of such an enclosure assembly and SSD include enclosure assembly 198, 232, or 242 and SSD 196, 230 or 240, which were previously disclosed with respect to FIGS. 6A-6I, FIG. 7, or FIG. 8, respectively.

Enclosure assembly 360 includes enclosure portions comprising top cover plate 366 and bottom cover plate 368. Top and bottom cover plates 366 and 368 are substantially similar to those disclosed with respect to enclosure assemblies 198, 232, and 242, such as top cover plate 200 or 234, and such as bottom cover plate 202 or 244. For instance in FIGS. 14B and 14G, top cover plate 366 includes a rib 370 having an interior rib surface 372, notches 374a-c, and a surface 376a which are respectively and substantially similar to rib 205, interior rib surface 210, notches 216a-c, and surface 207a of top cover plate 200 previously disclosed above. Bottom cover plate 368 includes a surface 376b and alignment guides 378a-c, which are respectively and substantially similar to surface 207b and alignment guides 197 and 212a-c, previously disclosed above for bottom cover plate 202 in FIGS. 6A and 6B. Unlike enclosure assembly 198, 232, or 242, however, enclosure assembly 360 further comprises a spacer 380.

Figure 14B:
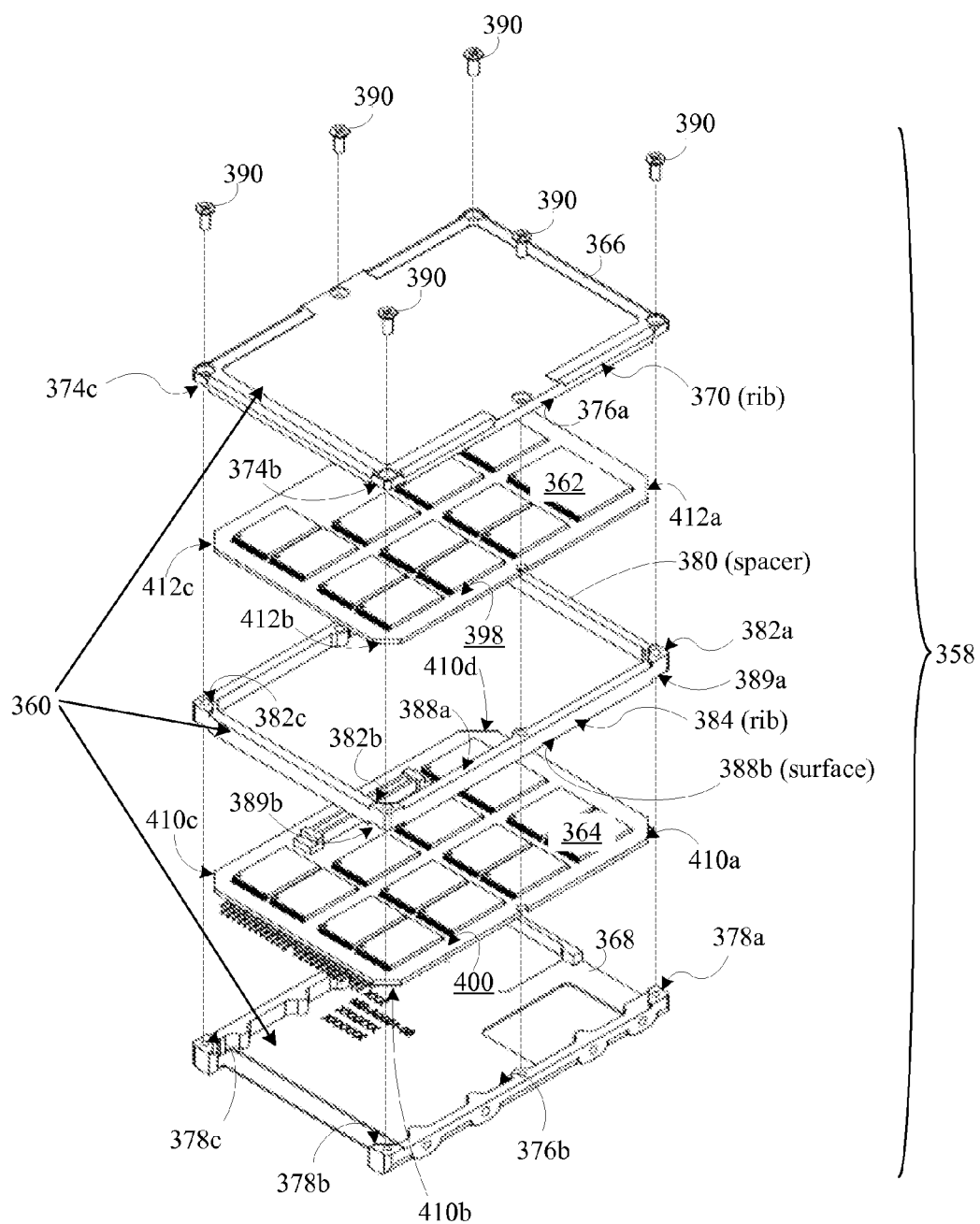
Figure 14D:
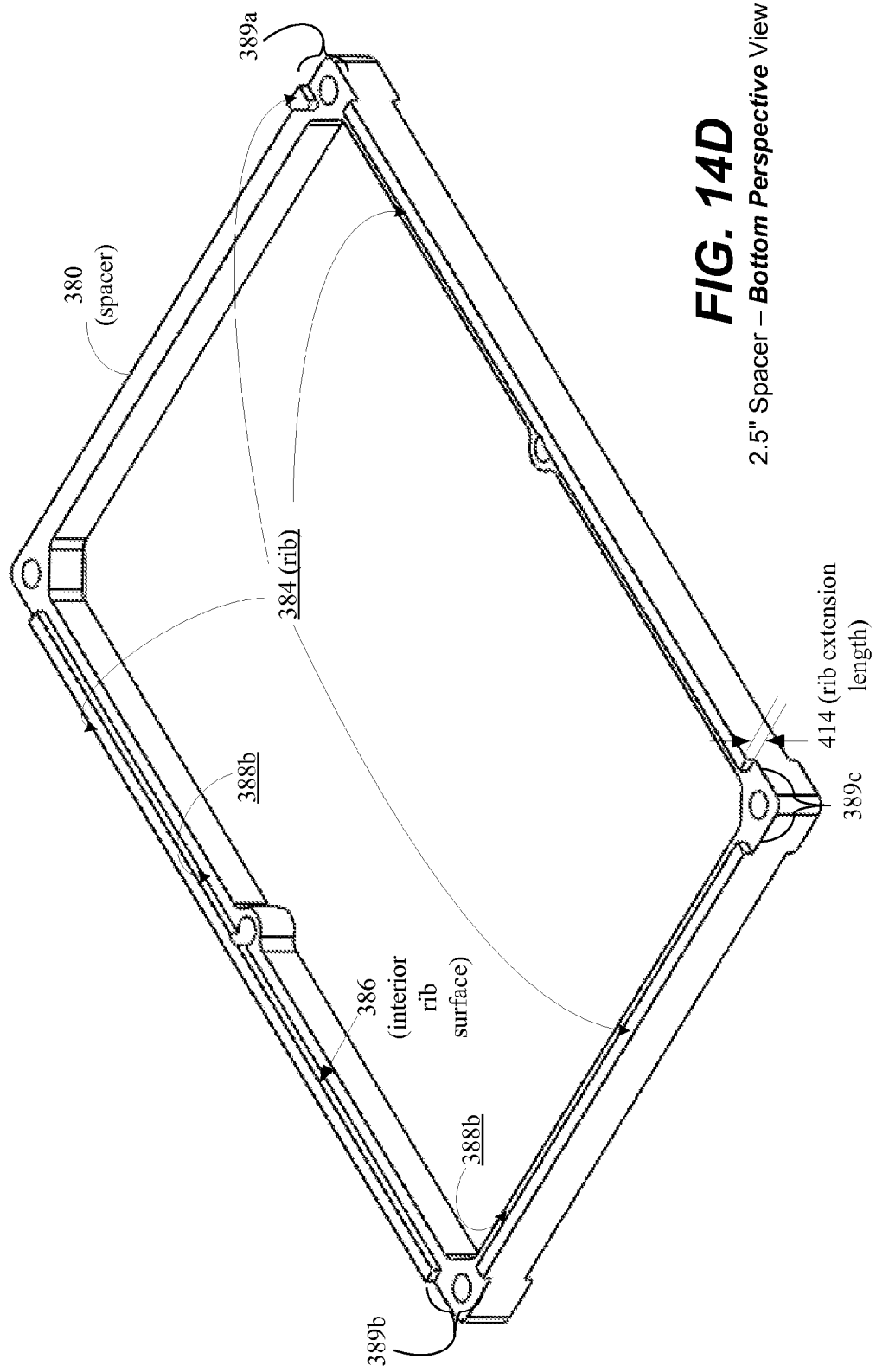
FIG. 14D is a bottom perspective view of a spacer for the embodiment disclosed in FIG. 14A in accordance with yet another embodiment of the present invention.
Figure 14E:
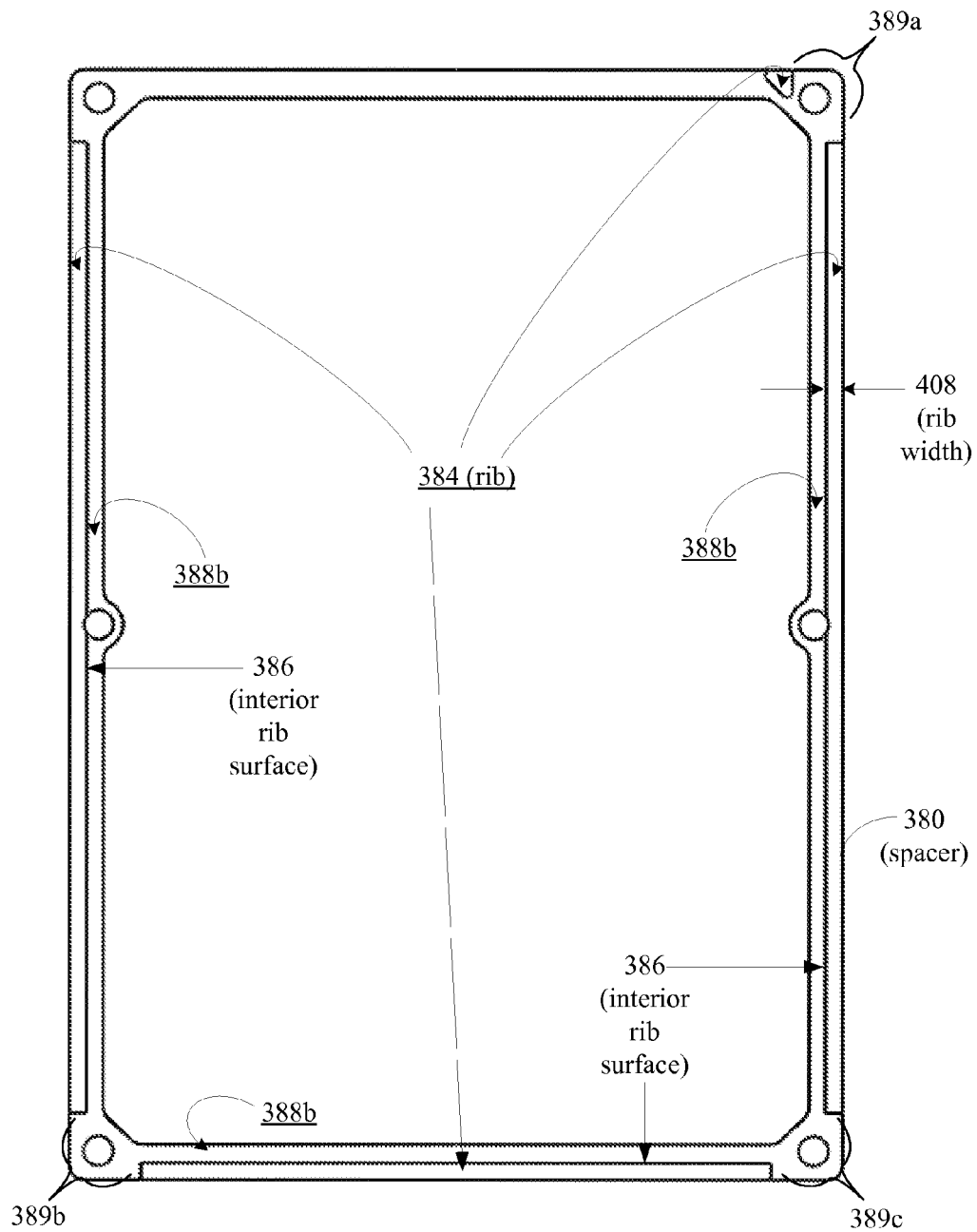
FIG. 14E is bottom view of the spacer in FIG. 14D.
Figure 14F:
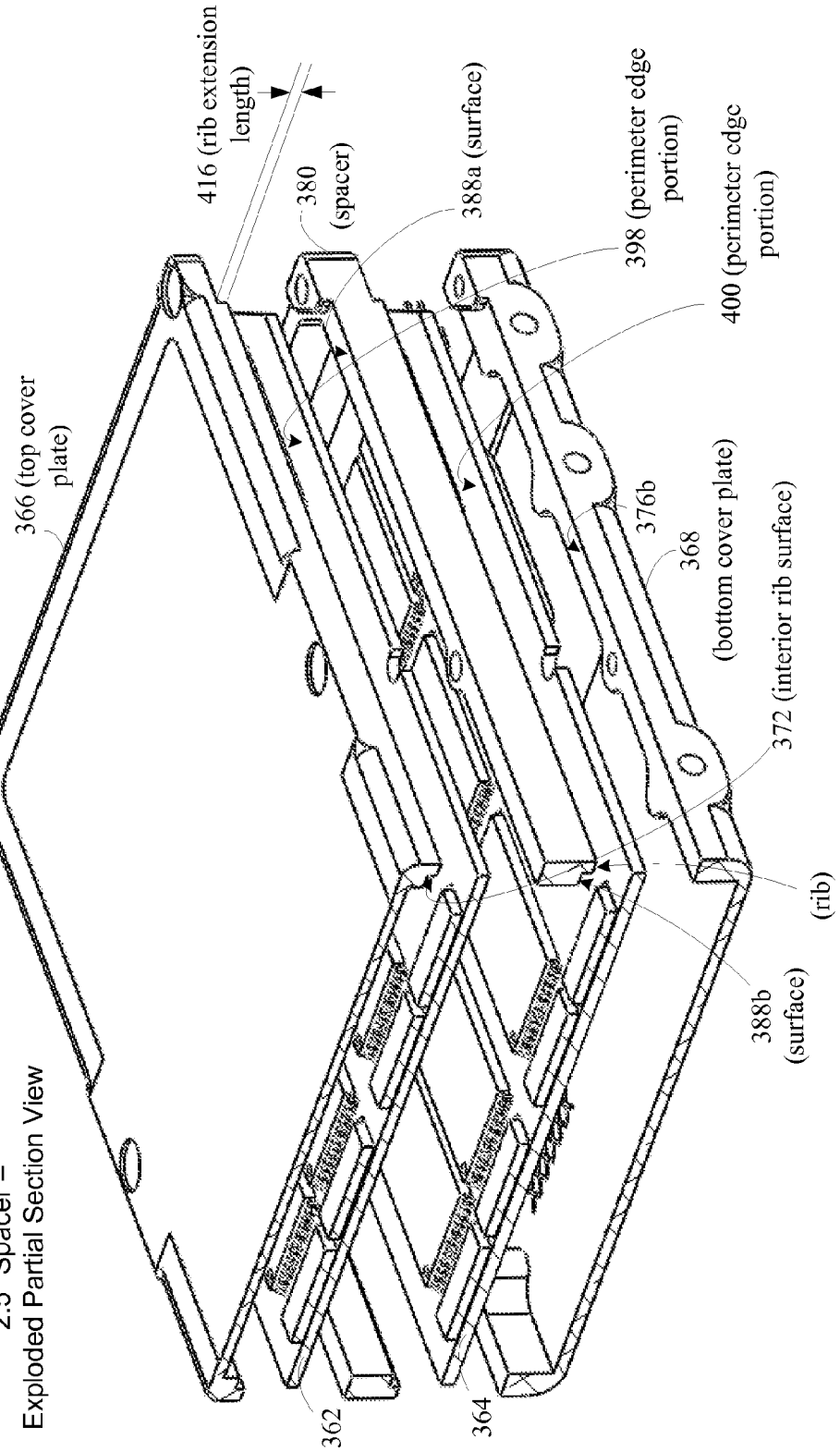
FIG. 14F is an exploded sectional view of Section G-G in FIG. 14A.

As illustrated in FIGS. 14B, 14E, and 14F, spacer 380 includes alignment guides 382a-c, a rib 384, an interior rib surface 386, and surfaces 388a-b, which are substantially similar to alignment guides 197 and 212a-c, a rib 290, an interior rib surface 210, and surfaces 207a and 207b in FIGS. 6A-6D. Spacer 380 also includes notches disposed on the corners of spacer 380, such as notches 389a-c. The number of alignment guides and notches disposed on spacer 380 is not intended to be limiting although in the current embodiment the number of alignment guides and notches used on spacer 380 is respectively equal to the number of notches and alignment guides selected for top and bottom cover plates 366 and 368, respectively. Spacer 380, top cover plate 366 and a bottom cover plate 368 are disposed to interlock and stack with each other as well as receive circuit boards 362 and 364.

Rib 384 is located on the perimeter of spacer 380 and provides additional stiffness to spacer 380. Circuit board 364 is coupled between bottom cover plate 368 and one side of spacer 380, such as surface 388b. Circuit board 362 is coupled between top cover plate 366 and another side of spacer 380, such as surface 388a. Circuit boards 362 and 366, spacer 380, top cover plate 366 and bottom cover plate 368 are fastened together by suitable fasteners, such as a set of six flat head screws 390. When assembled, spacer 380, and top and bottom cover plates 366 and 368 form enclosure assembly 360 and result in a SSD having at least two circuit boards, such as circuit boards 362 and 364, received within an enclosure assembly that complies with the 2.5 inch standard HDD form factor. The electrical components disposed on circuit boards 362 and 364 may be any components necessary to enable SSD 358 to function as a storage device. For instance, and referring now to FIG. 14C, circuit board 364 includes memory devices, such as NAND flash, a controller integrated circuit for controlling these memory devices, and an interface connector 392, and a board-to-board connector 394. Circuit board 362 may be used as a memory expansion board and may include additional memory components and a board-to-board connector 396 that can electrically couple to board-to-board connector 394.

When assembled to form SSD 358, perimeter edge portion 398 of circuit board 362 and perimeter edge portion 400 of circuit board 364 are each coupled to and located between two enclosure portions of enclosure assembly 360. In the example shown in FIGS. 14B and 14F, perimeter edge portion 400 is coupled to and located between bottom cover plate 368 at surface 376b and spacer 380 at surface 388b. Perimeter edge portion 400 is adjacent to interior rib surface 386 of rib 384 when circuit board 364 is placed between bottom cover plate 368 and spacer 380. Similarly, perimeter edge portion 398 is coupled to and located between top cover plate 366 at surface 376a and spacer 380 at surface 388a. Perimeter edge portion 398 is adjacent to interior rib surface 404 of rib 370 when circuit board 362 is placed between top cover plate 366 and spacer 380.

The stacking of spacer 380, top cover plate 366 and bottom cover plate 368 involves using notches 374a-d and 389a-d and alignment guides 378a-d and 382a-d. Notches 374a-d receive alignment guides 382a-d, respectively, and notches 389a-d receive alignment guides 378a-d. In the particular example shown in FIGS. 14B, 14E and 14G, notches 374a-c and notches 389a-c are each respectively formed on a surface of and into ribs 370 and 384. In addition, notches 374a-c of top cover plate 366, and notches 389a-c of spacer 380, each have a depth that does not exceed rib widths 406 and 408, creating voids for receiving alignment guides 382a-d and 378a-d, respectively. The number of notches formed on ribs 370 and 384 is not intended to be limiting. Moreover, the shapes of the alignment guides and notches disclosed herein are also not intended to limit the scope and spirit of the invention disclosed.

As shown in FIG. 14B, alignment guides 378a-d and alignment guides 382a-d each have a height that extends through and exceeds the thickness of the portion of circuit boards 364 and 362 which are adjacent to these alignment guides, respectively. With reference also to FIG. 6I, the positions of alignment guides 378a-d and alignment guides 382a-d are selected so circuit board notches 217a-d permit circuit boards 364 and 362 to be received by bottom cover plate 368 and spacer 380 within the inside surfaces of their respective alignment guides during assembly. In the embodiment shown in FIG. 14B, circuit boards 362 and 364 have the same length and width dimensions.

Figure 14G:
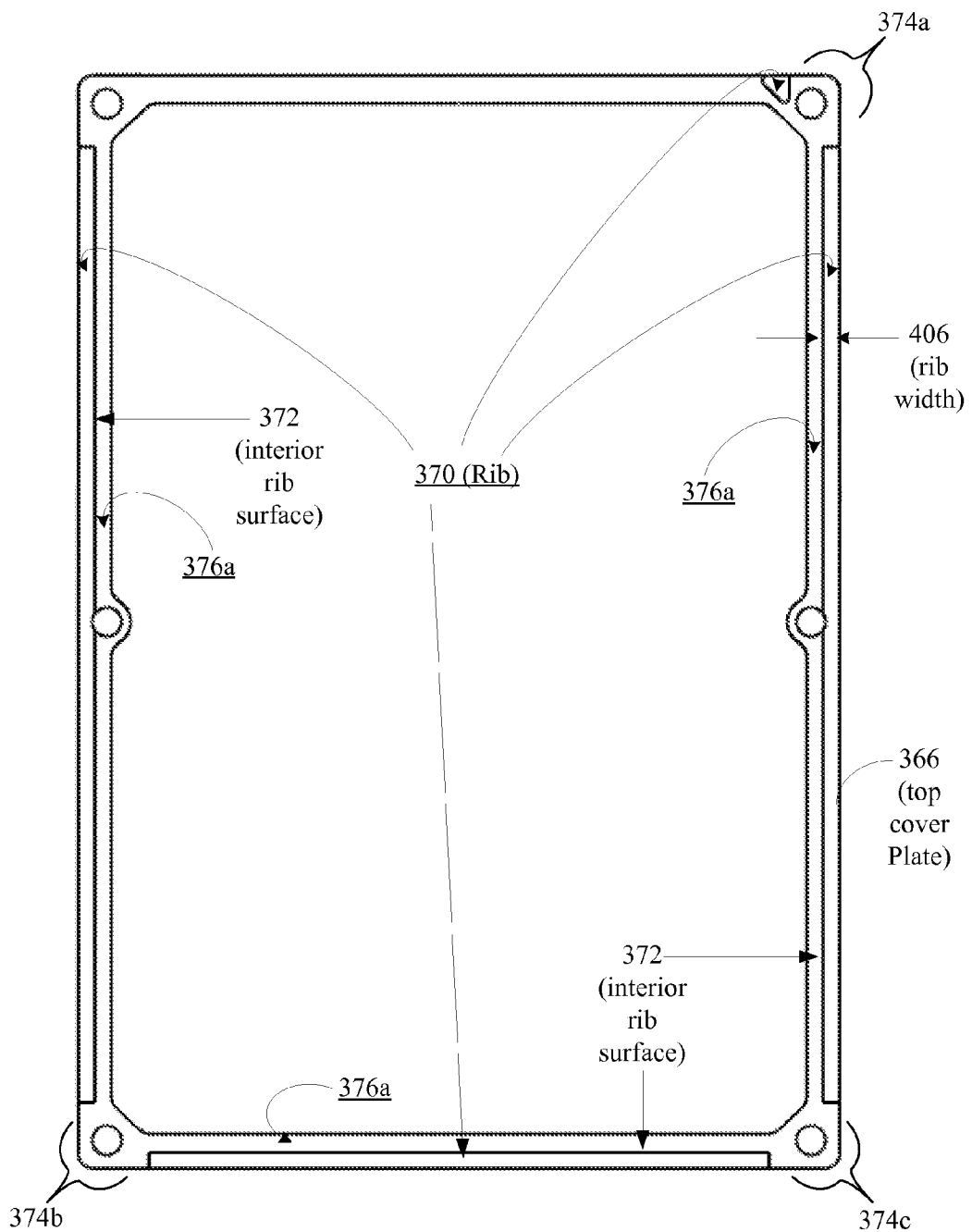
FIG. 14G is a top view illustration of the bottom cover plate in FIG. 14A.
Figure 14H:
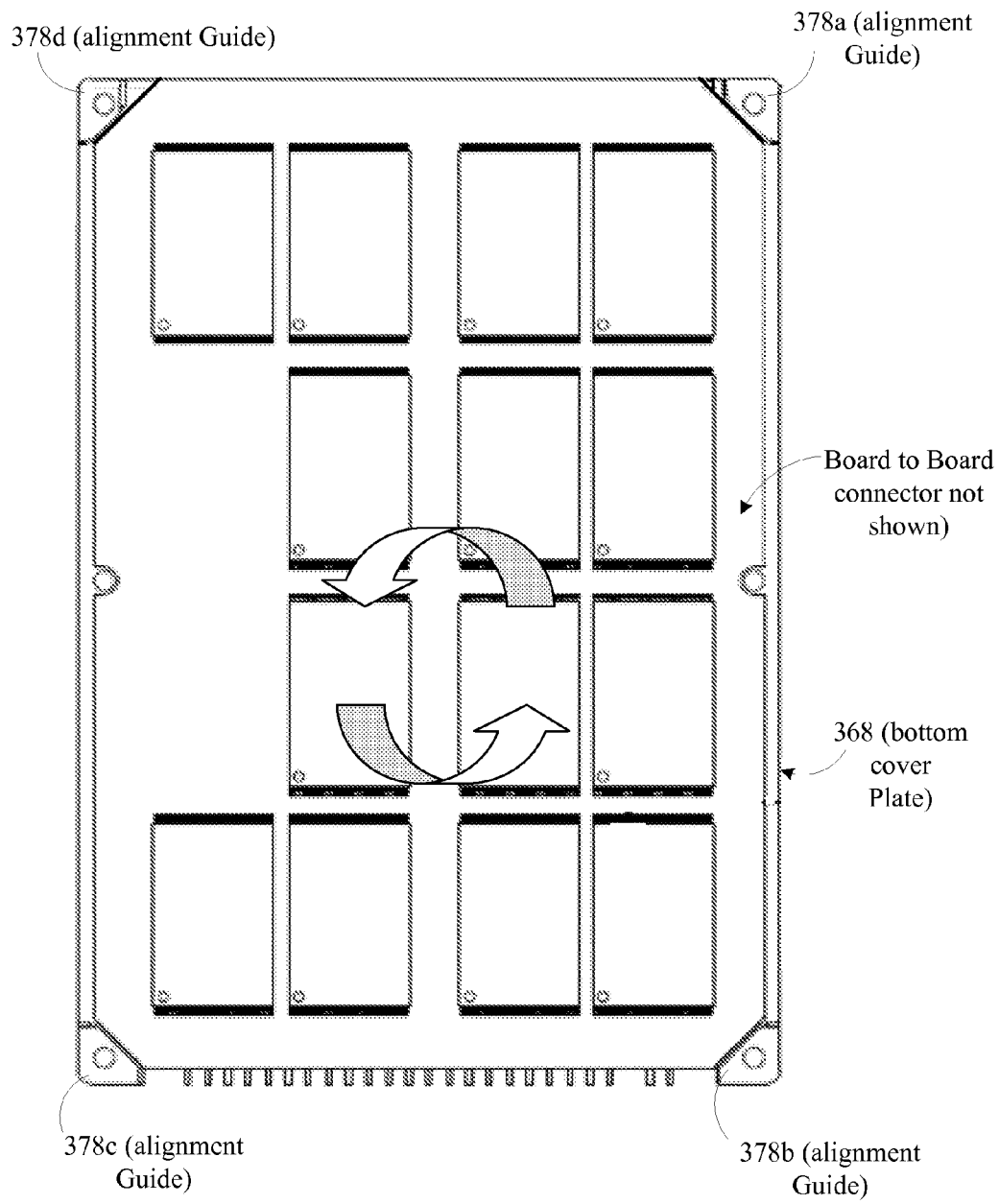
FIG. 14H is a bottom view of the top cover plate in FIG. 14A.

In FIGS. 14B, 14G and 14H, alignment guides 378a-d of bottom cover plate 368, alignment guides 382a-d of spacer 380, ribs 384 and 370, and notches 389a-c and 374a-c collectively function as an interlocking and stacking mechanism that permits enclosure portions, such as spacer 380, top cover plate 366 and bottom cover plate 368 to be interlocked and stacked together. In addition, when fastened together and used to receive and enclose circuit boards 362 and 364, this interlocking and stacking mechanism distributes mechanical stress, such as torsion, across the enclosure portions of enclosure assembly 360, reducing the amount of disruptive or damaging mechanical stress that might otherwise be transmitted to circuit boards 362 and 364.

As a further embodiment, at least one alignment guide, such as alignment guide 382d and 378d, from each set of alignment guides from spacer 380 and bottom cover plate 368, respectively, have a uniquely shaped surface that prevents a circuit board from being coupled between enclosure portions in the wrong orientation. This provides a "foolproof" assembly of SSD 358 by preventing a circuit board with matching notches, such as circuit board 364 and 362, from being placed in the wrong orientation between surfaces of enclosure portions, such as surfaces 376a and 388b, or surfaces 388a and 376b, respectively.

In accordance with yet a further embodiment of the present invention, rib 384 of spacer 380 in FIG. 14E, and rib 370 of top cover plate 366 in FIG. 14G are each formed so that they have rib extension lengths 414 and 416, respectively. Rib extension lengths 414 and 416 respectively extend from surfaces 376a and 388b in substantially the same manner as described for rib extension length 118 or 218 disclosed above. In addition, rib extension lengths 414 and 416 create gaps 117d, as shown in FIG. 15 below.

Rib extension lengths 414 and 416 also protect circuit boards 364 and 362 from electronic disturbance due to electro-static discharge (ESD), electro-magnetic interference (EMI), or both. Ribs 384 and 370 may be also coupled to an electrical ground (not shown) used by these circuit boards to further increase this electronic disturbance protection. Moreover, ribs 384 and 370 further stiffen spacer 380 and top cover plate 366, respectively, which further minimizes mechanical disturbance due to vibration which may be transferred circuit boards 364 and 362.

2.5 Inch Multi-Stack Implementation Generally

Figure 15:
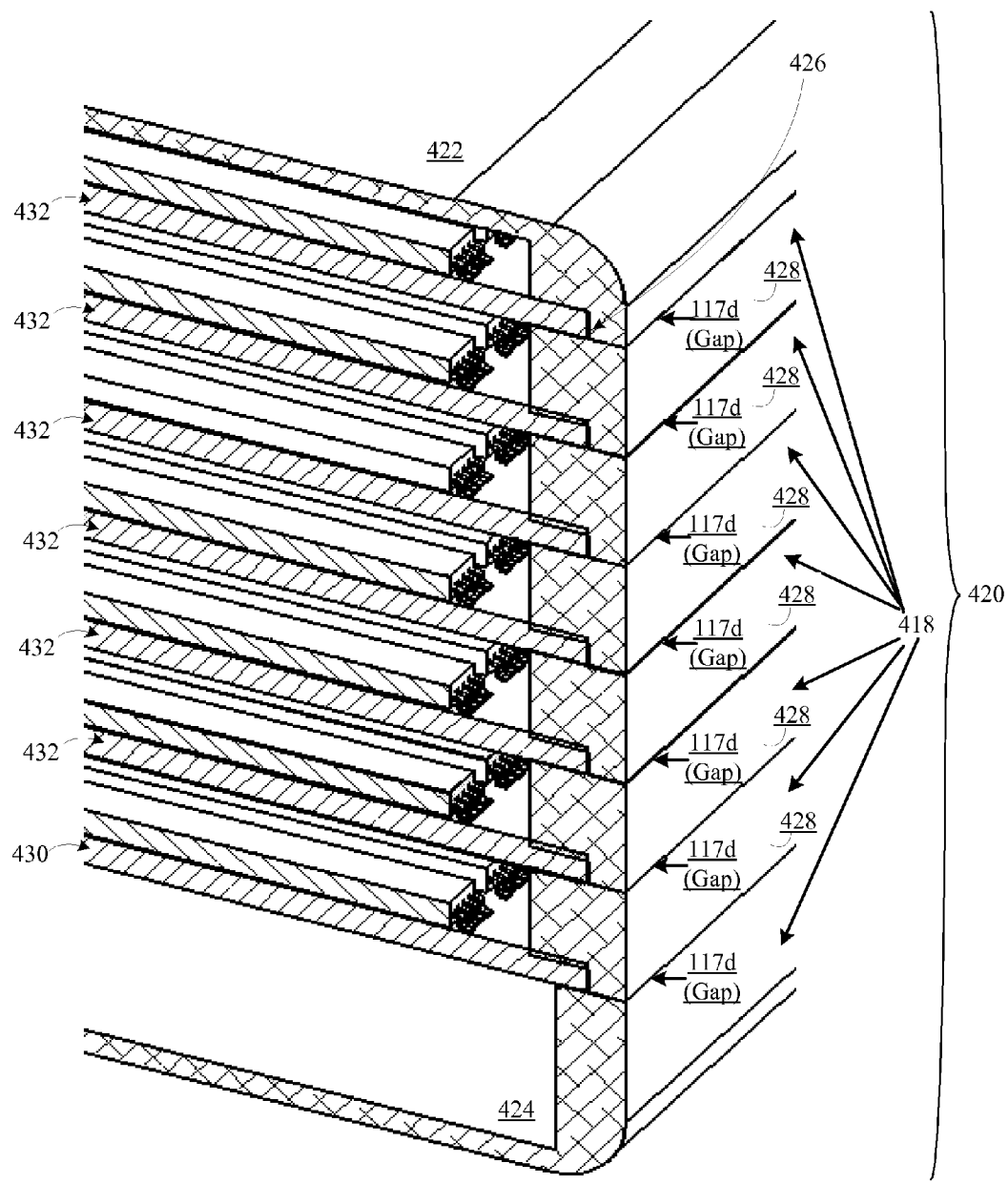
FIG. 15 is a cross-sectional perspective illustration a 2.5 inch HDD form factor compliant enclosure assembly supporting more than two circuit boards in accordance with yet another embodiment of the present invention.

Referring now to FIG. 15, another embodiment of a 2.5 inch HDD form factor compliant enclosure assembly 418 supporting more than two circuit boards is shown. This embodiment may also be herein referred to as a multi-stack 2.5 inch form factor compliant SSD enclosure assembly. Enclosure assembly 418 is similar to enclosure assembly 360 because it includes enclosure portions comprising top cover plate 422 and bottom cover plate 424, which are substantially similar to those disclosed with respect to enclosure assemblies 198 or 360, such as top cover plate 200 or 366, and bottom cover plate 202 or 368, which were previously disclosed above with respect to FIGS. 6A-6D and FIGS. 14A-14C, respectively. For instance, top cover plate 422 includes a rib 426 having an interior rib surface, notches, and a surface which are respectively and substantially similar to rib 370, interior rib surface (not yet assigned), notches 374a-d, and surface 376a of top cover plate 366. Bottom cover plate 424 includes alignment guides and a surface, which are respectively and substantially similar to alignment guides 378a-d and surface 376b. Unlike enclosure assembly 360, however, enclosure assembly 418 comprises more than one spacer, such as spacer 428. Spacer 428 is substantially similar to spacer 380.

Top cover plate 422, bottom cover plate 424, and spacers 428 are disposed to interlock and stack with each other as well as receive circuit boards 430 and 432. These circuit boards are coupled to each other through a board-to-board connector (not shown) and are received by enclosure assembly 418 as disclosed in FIG. 15. Increasing memory capacity may be performed by interlocking and stacking an additional circuit board and spacer, while decreasing memory capacity may be performed by removing a circuit board and spacer from enclosure assembly 418. When using screws to fasten enclosure assembly 418 would obviously require screws of different lengths based on the number of spacers and circuit boards used. Circuit boards 430 and 432 are substantially similar to circuit board 364 and 362, respectively, in FIGS. 14A-14C. Using multiple instances of spacer 428 permits a SSD that includes enclosure assembly 418 to receive more than one circuit board disposed with memory devices, such as circuit board 432, enabling this SSD to remain suitable for mounting in systems that require a 2.5" HDD form factor compliant storage device and that can receive storage devices of different heights.

Referring now to FIG. 16, an enclosure assembly 438 having a bottom cover plate 442 that includes a surface 444 which is extended closer to at least one component 446 on a circuit board 448 is disclosed in accordance with yet another embodiment of the present invention. Component 446 dissipates heat during operation of component 446. Enclosure assembly 438 may be used as part of a HDD form factor compliant SSD, such as those previously disclosed above, and further includes top cover plate 440. A thermal pad 450 is placed between surface 444 and component 446 so that thermal pad 450 contacts surface 444 and component 446. During operation, heat dissipating from component 446 conducts to surface 444, enabling bottom cover plate 442 to function as a heat-sink and improving heat dissipation away from component 446. Surface 444 may be formed by extrusion or stamping, depending on the type of manufacturing process used to form bottom cover plate 442. Top and bottom cover plates 440 and 442 are substantially similar in form and function as other top and bottom cover plates disclosed above, except bottom cover plate 442 has been modified to include surface 444.

While the present invention has been described in particular embodiments, it should be appreciated that the present invention should not be construed as limited by such embodiments. Rather, the present invention should be construed according to the claims below.

We claim:

1. An enclosure assembly for a solid-state storage device having a circuit board, comprising:
   means for receiving said circuit board within a perimeter rib and for distributing mechanical stress across the enclosure assembly;
   wherein said perimeter rib comprises a rib notch;
   wherein said means comprises a tab on a bottom cover plate, wherein the tab is received by the rib notch.

2. The enclosure assembly of claim 1, wherein said circuit board includes notches; and further including a pair of alignment guides disposed to fit within said notches.

3. A solid-state storage device, comprising:
   an enclosure comprising means for stacking enclosure portions with each other and for distributing mechanical stress across said enclosure portions;
   said means including a first rib disposed on one of said enclosure portion; and
   a first circuit board having a first circuit board perimeter edge portion coupled to and located between at least two of said enclosure portions;
   said means further comprising means for interlocking said enclosure portions and said enclosure portions are comprised of a first cover plate and a second cover plate;
   said first cover plate disposed with said first rib;
   said first rib disposed with a notch; and
   further including a tab disposed on said second cover plate.

4. The solid-state storage device of claim 3, wherein said notch receives said tab.

5. The solid-state storage device of claim 3, wherein said enclosure portions further comprise a spacer disposed with a second rib having a second notch and a second tab; and
   further including a second circuit board having a second circuit board perimeter edge portion situated between a first spacer surface and said first cover plate; and
   said second circuit board electrically coupled to said first circuit board.

6. The solid-state storage device of claim 3, said means for interlocking further including fasteners and means for receiving said first circuit board; and said first rib is disposed on a perimeter of said first cover plate.

7. The solid-state storage device of claim 3,
   wherein said first cover plate includes said first rib having a rib extension length that extends from a first surface of said first cover plate; and
   said second cover plate having a second surface.

8. The solid-state storage device of claim 7, wherein said first circuit board includes said first circuit board perimeter edge portion that is situated between said first and second surfaces, said first circuit board perimeter edge portion having a thickness that exceeds said rib extension length.

9. The solid-state storage device of claim 7, wherein:
   said first rib includes an interior rib surface; and
   said first circuit board includes said first circuit board perimeter edge portion that is situated between said first and second surfaces, said first circuit board perimeter edge portion adjacent to said interior rib surface.

10. A solid-state drive, comprising:
    a first cover plate that includes a rib having a rib extension length that extends from a first surface of said first cover plate, said rib also having an interior rib surface;
    a second cover plate having a second surface;
    a first circuit board having a perimeter board edge portion that is situated between said first and second surfaces, said perimeter board edge portion having a thickness that does not exceed said rib extension length;
    wherein said rib comprises a rib notch;
    wherein said second cover plate comprises a tab; and
    wherein said rib notch receives said tab.

11. The solid-state drive of claim 10, said perimeter board edge portion further includes a notch disposed to receive an alignment guide.

12. The solid-state drive of claim 10, wherein said perimeter board edge portion includes a first circuit board edge disposed adjacent to said interior rib surface.

13. The solid-state drive of claim 12, wherein said edge is formed continuously around said circuit board, and said interior rib surface is continuously adjacent to said first circuit board edge, said rib coupled to a ground rail used by the solid-state storage device.

14. The solid-state drive of claim 13, wherein said rib provides protection from electronic disturbance includes electro-static discharge and electro-magnetic interference.

15. The solid-state drive of claim 10, further including a spacer, and a second circuit board; and
    said second circuit board is electrically coupled to said first circuit board and includes a second circuit board edge adjacent to an inward surface of said spacer.

16. The solid-state drive of claim 15, said first and second cover plates and said spacer each disposed to have a length and width that comply with a standard HDD form factor.

17. The solid-state drive of claim 15, said standard HDD form factor including any one of: 3.5, 2.5, 1.8, 1, and 0.8 inches.

18. The solid-state drive of claim 10, wherein said second cover plate includes a first alignment guide and a first tab; and said rib disposed between said first alignment guide and said tab.

19. The solid-state drive of claim 18, wherein said second cover plate further includes a second alignment guide and a second tab.

20. The solid-state drive of claim 10, further including a first cover plate post and a second cover plate post that are disposed to form a post when said first and second cover posts are fastened during said coupling of said first circuit board between said first and second cover plates.

21. The solid-state drive of claim 10, further including a first cover plate post, a second cover plate post, and a spacer post that are disposed to form a post when said spacer post and first and second cover posts are fastened during assembly.

22. The solid-state drive of claim 10, further including:
a first alignment guide and a first tab disposed on said second cover plate,
a second alignment guide, a second tab, and a rib disposed on a spacer, said rib including a notch disposed to receive said first tab;
said first alignment guide, said first cover plate and said second alignment guide fastened together by a fastener;
said rib disposed between said first alignment guide and said first tab; and
wherein said coupling of said first and second alignment guides and said cover plate distribute torsion applied to the solid-state drive among said first and second cover plates and said spacer.

23. The solid-state drive of claim 22, wherein said perimeter board edge portion includes a notch disposed to receive said first alignment guide; said first circuit board further includes another perimeter board edge portion that includes another notch disposed to receive said second alignment guide; and said first and second alignment guides disposed in an offset position relative to each other which precludes said first circuit board from being coupled between said first and second surfaces in the wrong orientation.

24. The solid-state drive of claim 10, further including a thermal pad coupled between a heat dissipating component on said first circuit board and said second cover plate.

25. The solid-state drive of claim 10, wherein the first circuit board comprises a circuit board notch in the perimeter board edge portion, wherein the second cover plate comprises an alignment guide, and wherein the circuit board notch receives the alignment guide.

* * * * *